United States Patent
Harada et al.

(10) Patent No.: US 9,799,112 B2
(45) Date of Patent: Oct. 24, 2017

(54) METHOD FOR MEASURING OVERLAY AND MEASURING APPARATUS, SCANNING ELECTRON MICROSCOPE, AND GUI

(71) Applicant: Hitachi High-Technologies Corporation, Minato-ku, Tokyo (JP)

(72) Inventors: Minoru Harada, Tokyo (JP); Ryo Nakagaki, Tokyo (JP); Fumihiko Fukunaga, Tokyo (JP); Yuji Takagi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 477 days.

(21) Appl. No.: 14/370,727

(22) PCT Filed: Feb. 6, 2013

(86) PCT No.: PCT/JP2013/052657
§ 371 (c)(1),
(2) Date: Jul. 3, 2014

(87) PCT Pub. No.: WO2013/121939
PCT Pub. Date: Aug. 22, 2013

(65) Prior Publication Data
US 2014/0375793 A1     Dec. 25, 2014

(30) Foreign Application Priority Data

Feb. 17, 2012   (JP) ................................ 2012-032307

(51) Int. Cl.
*H04N 7/18*      (2006.01)
*G06T 7/00*      (2017.01)
(Continued)

(52) U.S. Cl.
CPC .......... *G06T 7/001* (2013.01); *G03F 7/70633* (2013.01); *H01L 23/544* (2013.01);
(Continued)

(58) Field of Classification Search
CPC ......... H01L 23/544; H01L 2223/54453; H01L 22/12; H01L 2924/0002; H01L 2924/00;
(Continued)

(56) References Cited

U.S. PATENT DOCUMENTS 7,181,057 B2    2/2007  Adel et al.
7,608,468 B1*  10/2009  Ghinovker .......... G03F 7/70633
                                                    356/401
(Continued)

FOREIGN PATENT DOCUMENTS

JP    2006-351888 A    12/2006
JP    2011-142321 A     7/2011

*Primary Examiner* — Mohammed Rahaman
*Assistant Examiner* — Richard Carter
(74) *Attorney, Agent, or Firm* — Miles & Stockbridge P.C.

(57) ABSTRACT

A method for measuring overlay at a semiconductor device on which circuit patterns are formed by a plurality of exposure processes is characterized in including an image capturing step for capturing images of a plurality of areas of the semiconductor device, a reference image setting step for setting a reference image based on a plurality of the images captured in the image capturing step, a difference quantifying step for quantifying a difference between the reference image set in the reference image setting step and the plurality of images captured in the image capturing step, and an overlay calculating step for calculating the overlay based on the difference quantified in the difference quantifying step.

19 Claims, 23 Drawing Sheets

(51) Int. Cl.
*G03F 7/20* (2006.01)
*H01L 23/544* (2006.01)
*H01L 21/66* (2006.01)

(52) U.S. Cl.
CPC ............... *G06T 2200/24* (2013.01); *G06T 2207/10061* (2013.01); *G06T 2207/30148* (2013.01); *H01L 22/12* (2013.01); *H01L 2223/54453* (2013.01); *H01L 2924/0002* (2013.01)

(58) Field of Classification Search
CPC . G03F 7/70633; G06T 7/001; G06T 2200/24; G06T 2207/10061; G06T 2207/30148
USPC ............. 348/80; 356/401, 622; 382/141; 250/307, 310
See application file for complete search history.

(56) References Cited

U.S. PATENT DOCUMENTS

| | | | |
|---|---|---|---|
| 8,148,682 B2 | 4/2012 | Hotta et al. | |
| 8,577,124 B2 | 11/2013 | Toyoda et al. | |
| 2006/0108524 A1* | 5/2006 | Nagatomo | G03F 1/144 250/310 |
| 2007/0221842 A1* | 9/2007 | Morokuma | G01N 23/2251 250/307 |
| 2008/0094642 A1* | 4/2008 | Okita | G03F 9/7092 356/622 |
| 2010/0021040 A1* | 1/2010 | Kawamoto | G06K 9/6204 382/141 |

* cited by examiner

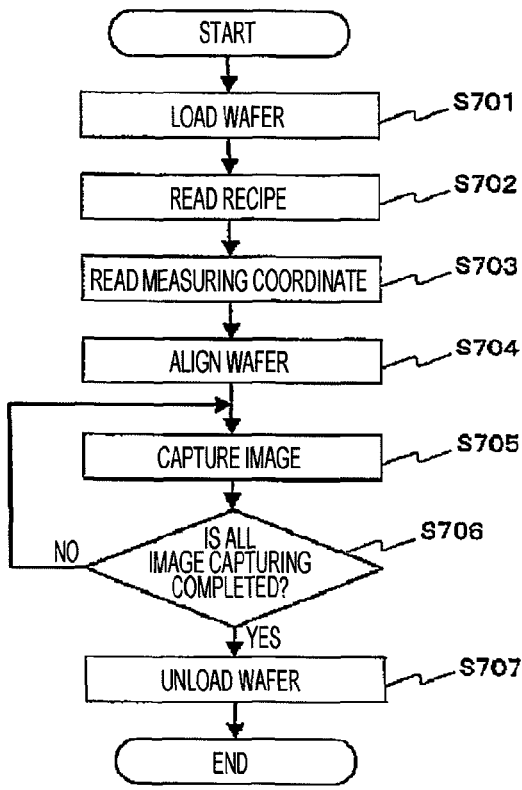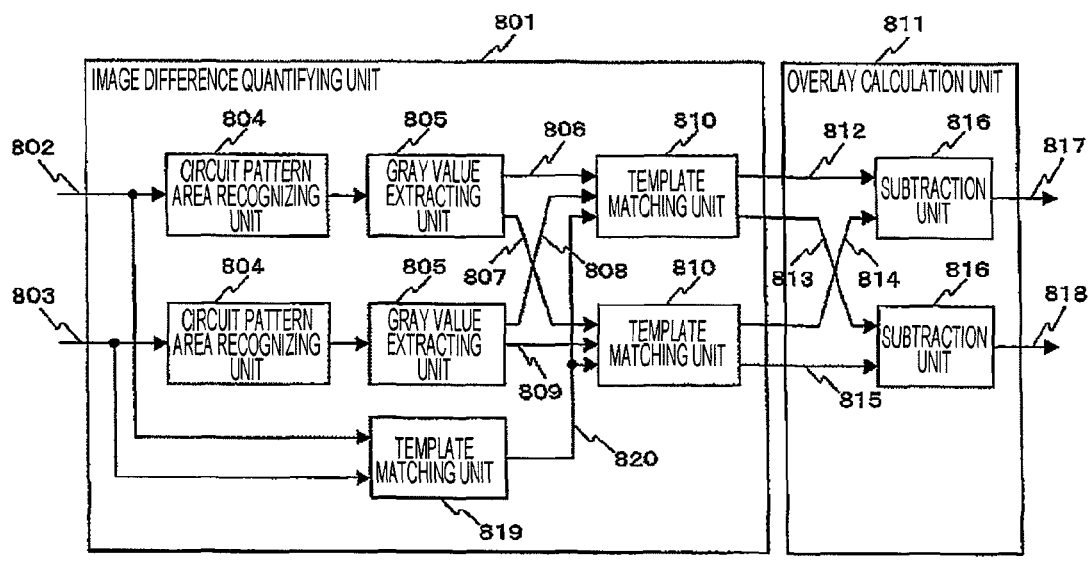

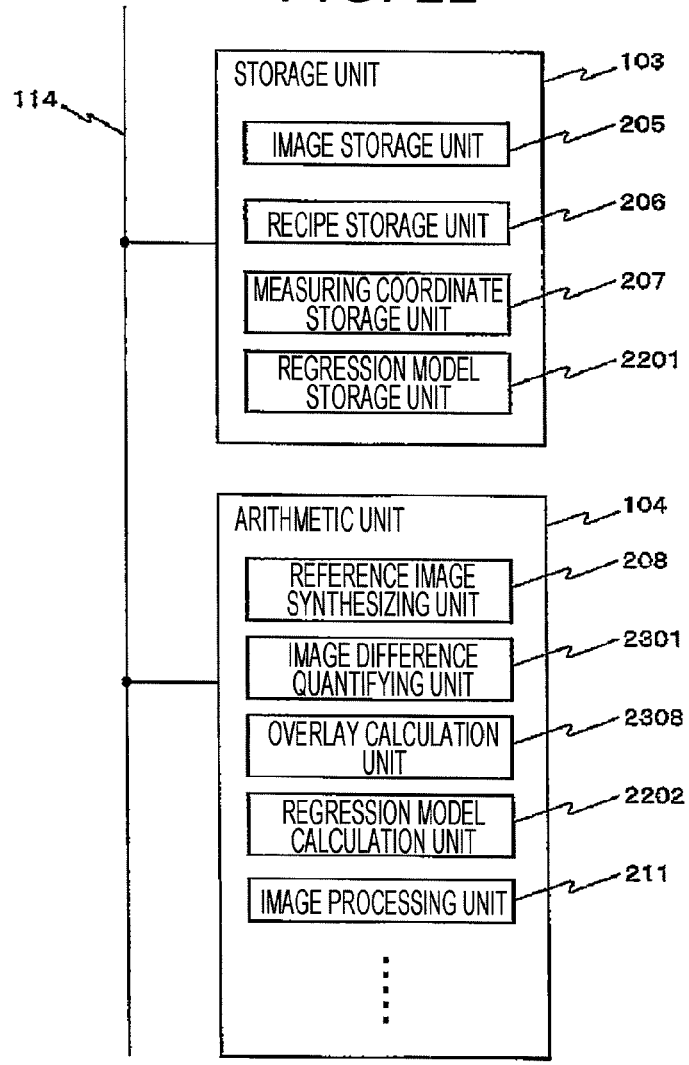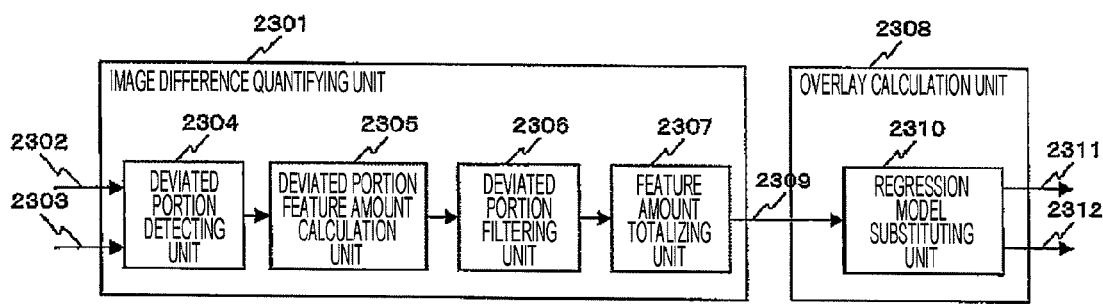

METHOD FOR MEASURING OVERLAY AND MEASURING APPARATUS, SCANNING ELECTRON MICROSCOPE, AND GUI

TECHNICAL FIELD

The present invention relates to a method for measuring overlay and a measuring apparatus, a scanning electron microscope, and a GUI, more specifically, relating to the method and apparatus for measuring the overlay by using an image captured by a charged particle microscope.

BACKGROUND ART

Generally, multiple times of exposure processes are necessary for semiconductor products in order to form circuit patterns required for operation. For example, in the case of manufacturing a semiconductor product formed of a plurality of layers of the circuit patterns, the exposure processes are necessary to be performed to form holes for connecting the respective layers in addition to the exposure processes to form the respective layers of the circuit patterns. Further, in recent years, double patterning is performed in order to form fine circuit patterns with high density.

In the semiconductor manufacturing, it is important to adjust, within a permissible range, positions of the circuit patterns formed by the multiple times of the exposure processes. In the case where the positions of the circuit patterns cannot be adjusted within the permissible range, proper electric characteristic cannot be obtained and yield is decreased. For this reason, positional deviation of the circuit patterns (overlay) between the respective exposure processes is measured to feed back to an exposure device.

As a method for measuring the overlay, U.S. Pat. No. 7,181,057 (PTL 1) discloses a method, in which a circuit pattern for measurement is formed on a wafer and an image of the pattern for measurement is captured by using an optical microscope, so that the overlay is measured based on a signal waveform obtained from the image. The pattern for measurement is generally formed on a scribe line in the periphery of a semiconductor die because the pattern for measurement needs to have a size approximately several tens of micrometers. Therefore, the overlay cannot be directly measured in a place where the circuit patterns of an actual device (actual patterns) are formed, and it is necessary to estimate the overlay by interpolation or the like. However, due to recent micro-miniaturization in the semiconductor process, the permissible range of the overlay is becoming more reduced and it is difficult to obtain necessary measurement accuracy.

JP 2006-351888 A (PTL 2) and JP 2011-142321 A (PTL 3) disclose methods for measuring the overlay by capturing an image of an actual pattern by using a scanning electron microscope. PTL 2 discloses the method for measuring the overlay, in which contour information of a circuit pattern extracted from the captured image is compared with design information (CAD data) of a semiconductor product. Also, PTL 3 discloses the method for measuring the overlay, in which a relative position between a circuit pattern formed by a first exposure and a circuit pattern formed by a second exposure is calculated, and the relative position is compared with a reference value obtained from the CAD data.

CITATION LIST

Patent Literature

PTL 1: U.S. Pat. No. 7,181,057
PTL 2: JP 2006-351888 A
PTL 3: JP 2011-142321 A

SUMMARY OF INVENTION

Technical Problem

As described above, according to the overlay measuring method disclosed in PTL 1, it is not possible to measure the overlay of the actual patterns. To solve this problem, the methods disclosed in PTL 2 and PTL 3 in which the overlay is measured by using the captured image of the actual patterns. However, according to the overlay measuring method disclosed in PTL 2, the CAD data is necessary. Generally, the CAD data of the semiconductor product has a volume of several GB and requires time and work for preparation and handling. Further, a circuit pattern shape formed on the wafer generally differs from a circuit pattern shape inside the CAD data, and therefore, in the case where such a difference is large, it may be presumed that the overlay can be hardly measured correctly. Additionally, according to the overlay measurement disclosed in PTL 3, since the relative position of the circuit patterns is calculated, in the case where a circuit pattern is partly missing due to defective formation of the circuit pattern or the like, it may be presumed that the overlay cannot be correctly calculated. Also, since it is necessary to compare the calculated relative position with the reference value, it is necessary to calculate the reference value beforehand by using the CAD data and the like.

As described above, according to the related arts, it is difficult to measure the overlay simply and robustly. In view of such situations, the present invention provides a method for measuring the overlay and a measuring apparatus, in which the overlay can be measured simply and robustly without using the CAD data.

Solution to Problem

To solve the above problems, for example, configurations recited in the scope of claims are adopted.

The present invention is characterized in including a plurality of means that solves the above problems, for example, an image capturing step for capturing images of a plurality of areas of a semiconductor device, a reference image setting step for setting a reference image based on a plurality of the images captured in the image capturing step, a difference quantifying step for quantifying a difference between the reference image set in the reference image setting step and the plurality of images captured in the image capturing step, and an overlay calculating step for calculating overlay based on the difference quantified in the difference quantifying step.

Advantageous Effects of Invention

According to the present invention, it is possible to provide a method for measuring overlay and a measuring apparatus, in which the overlay of the actual patterns can be measured easily and robustly without necessity of using the CAD data except for captured images and without inputting any reference value of the relative position.

The problems to be solved, configurations, and advantageous effects other than those described above will be clarified by embodiments described below.

BRIEF DESCRIPTION OF DRAWINGS

FIG. 7 is a flowchart illustrating an image capturing processing according to the present invention.

FIG. 8 is a diagram illustrating a configuration of an image difference quantifying unit and an overlay calculation unit according to the present invention.

FIG. 22 is a diagram illustrating a configuration of the storage unit and the arithmetic unit of the overlay measuring apparatus according to the present invention.

FIG. 23 is a diagram illustrating a configuration of the image difference quantifying unit and the overlay calculation unit according to the present invention.

DESCRIPTION OF EMBODIMENTS

First Embodiment

An overlay measuring apparatus and a measuring method according to the present invention will be described below. According to the present embodiment, a description will be given for a case in which overlay is measured by using an image captured by a scanning electron microscope (SEM) including an overlay measurement unit. However, an imaging device according to the present invention may be other than the SEM, for example, an imaging device using charged particle radiation such as ions.

Figure 1:
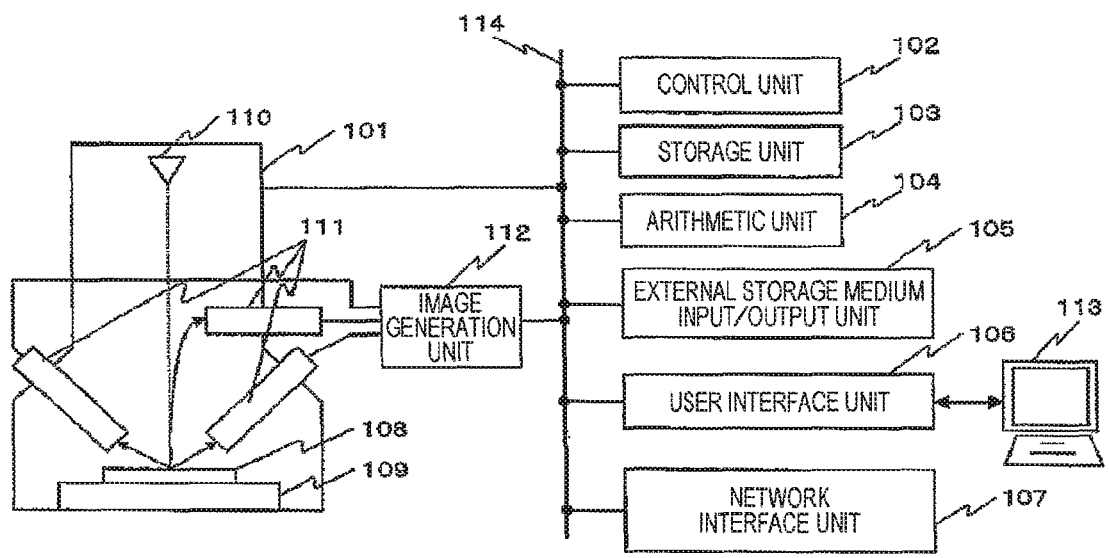
FIG. 1 is a diagram illustrating a configuration of a scanning electron microscope (SEM) including an overlay measuring apparatus according to the present invention.

FIG. 1 is a diagram illustrating a configuration of the scanning electron microscope (SEM) including the overlay measuring apparatus according to the present invention, and the SEM includes an SEM 101 that captures an image of an object to be checked, a control unit 102 that executes total control, a storage unit 103 that stores image capturing results, etc. in a magnetic disk, a semiconductor memory or the like, an arithmetic unit 104 that performs computing in accordance with a program, an external storage medium input/output unit 105 that executes input and output of information with an external storage medium connected to the apparatus, a user interface unit 106 that controls information input/output with a user, and a network interface unit 107 that communicates with other devices via a network.

Further, the user interface unit 106 is connected to an input/output terminal 113 formed of, for example, a keyboard, a mouse, a display, and so on.

The SEM 101 includes a movable stage 109 on which a sample wafer 108 is mounted, an electron source 110 for irradiating the sample wafer 108 with electron beam, and a detector 111 that detects secondary electron, reflected electron and the like generated from the sample wafer, and further includes an electron lens (not illustrated) that converges the electron beams on the sample, a deflector (not illustrated) that scans electron beam on the sample wafer, an image generation unit 112 that generates a digital image by converting a signal from the detector 111 to a digital signal, and so on. Meanwhile, the above components are connected via a bus 114, and information can be mutually exchanged between the components.

Figure 2:
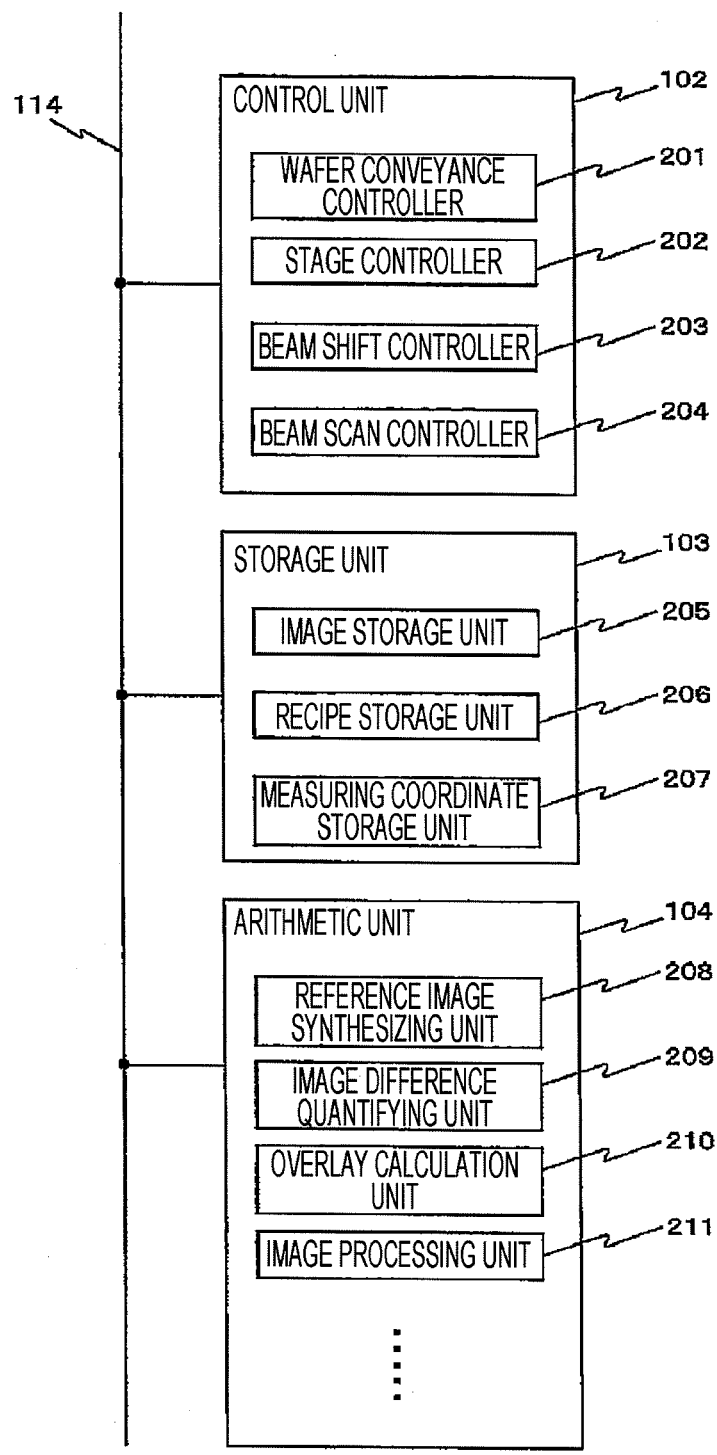
FIG. 2 is a diagram illustrating a configuration of a control unit a storage unit, and an arithmetic unit of the overlay measuring apparatus according to the present invention.

FIG. 2 is a diagram illustrating detailed configuration of the control unit 102, storage unit 103, and arithmetic unit 104 of the scanning electron microscope (SEM) including the overlay measuring apparatus according to the present invention illustrated in FIG. 1.

The control unit 102 includes a wafer conveyance controller 201 that controls conveyance of a wafer, a stage controller 202 that controls the stage, a beam shift controller 203 that controls an irradiating position of the electron beam, and a beam scan controller 204 that controls electron beam scanning.

The storage unit 103 includes an image storage unit 205 that stores acquired image data, a recipe storage unit 206 that stores imaging conditions (e.g., accelerating voltage, probe current, number of added frames, visual field size for image capturing, etc.), processing parameters and so on, and a measuring coordinate storage unit 207 that stores a coordinate of a measuring spot.

The arithmetic unit 104 includes a reference image synthesizing unit 208 that synthesizes a reference image based on captured images, an image difference quantifying unit 209 that quantifies a difference between the reference image and the measurement target image, an overlay calculation unit 210 that calculates the overlay, and an image processing unit 211.

Meanwhile, the above components 208 to 210 may be configured as hardware designed to carry out respective operations, and also may be configured as software so as to be executed using a versatile arithmetic device (for example, CPU, GPU, etc.).

Next, a method for acquiring an image of a designated coordinate will be described. First, a measurement target wafer 108 is placed on the stage 109 by operating a robot arm operated under the control of the wafer conveyance controller 201. Next, the stage 109 is moved by the stage controller 202 such that an imaging visual field is contained within a beam irradiation range. At this point, to absorb a stage movement error, a stage position is measured and a beam irradiated position is adjusted by the beam shift controller 203 such that the movement error may be cancelled. The electron beam is emitted from the electron source 110, and scanned within the imaging visual field by the beam scan controller 204. A secondary electron and a reflected electron generated from the wafer by the beam irradiation is detected by the detector 111 and converted to a digital image through the image generation unit 112. The captured image is stored in the image storage unit 205 together with accessory information such as imaging conditions and imaging date and time.

Figure 3:
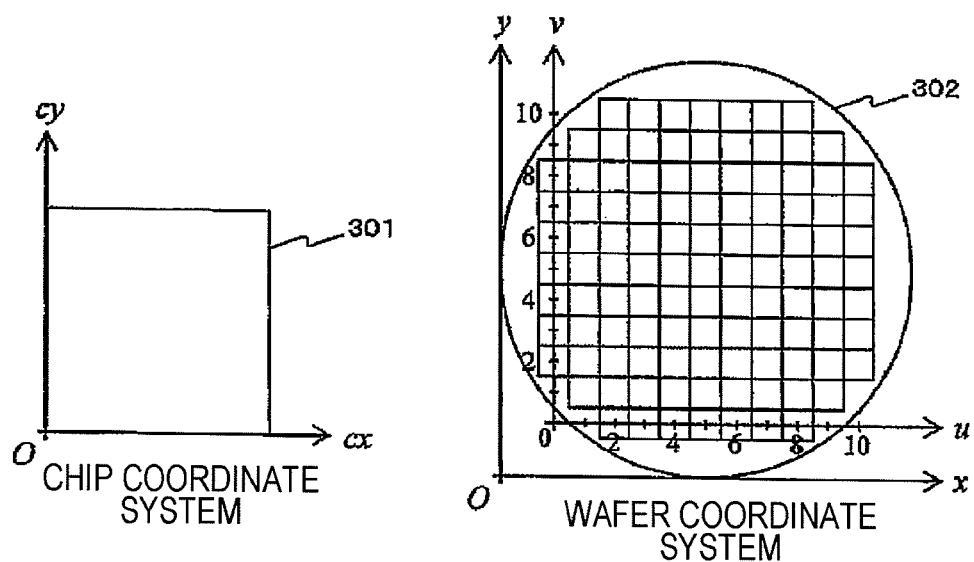
FIG. 3 is a diagram illustrating a chip coordinate system and a wafer coordinate system.

Here, a measuring coordinate which is to be an input in the overlay measurement according to the present invention will be described. FIG. 3 is a diagram illustrating a coordinate system of a chip 301 on a semiconductor wafer and a coordinate system of a wafer 302.

The chip coordinate system is a coordinate system in which one point on the chip is set as an origin, and the wafer coordinate system is a coordinate system in which one point on the wafer is set as an origin. Normally, a plurality of chips is laid out on the wafer, and a relation between a chip coordinate (cx, cy) and a wafer coordinate (x, y) on the chip located at a position (u, v) is expressed in Mathematical Formula 1 below. Therefore, mutual conversion can be easily performed. Note that W and H indicate a width and a height of a chip, and $o_x$ and $o_y$ indicate an offset of the x coordinate and an offset of the y coordinate.

Therefore, a user is only to designate a chip coordinate and a measurement target chip for the overlay measuring. For instance, in the case of designating the chip coordinates at n points and the measurement target chips at m spots, n×m points of the measuring coordinates can be obtained. In the method for measuring overlay according to the present embodiment, images having the same chip coordinate are deemed as one group. Due to this image grouping, a position ID is assigned to each chip coordinate as the accessory information of an image at the time of image capturing (in the above exemplified case, position ID: 1 to n).

$$\begin{pmatrix} x \\ y \end{pmatrix} = \begin{pmatrix} u \\ v \end{pmatrix} (W \quad H) + \begin{pmatrix} cx \\ cy \end{pmatrix} + \begin{pmatrix} o_x \\ o_y \end{pmatrix} \quad \text{[Mathematical Formula 1]}$$

Figure 4:
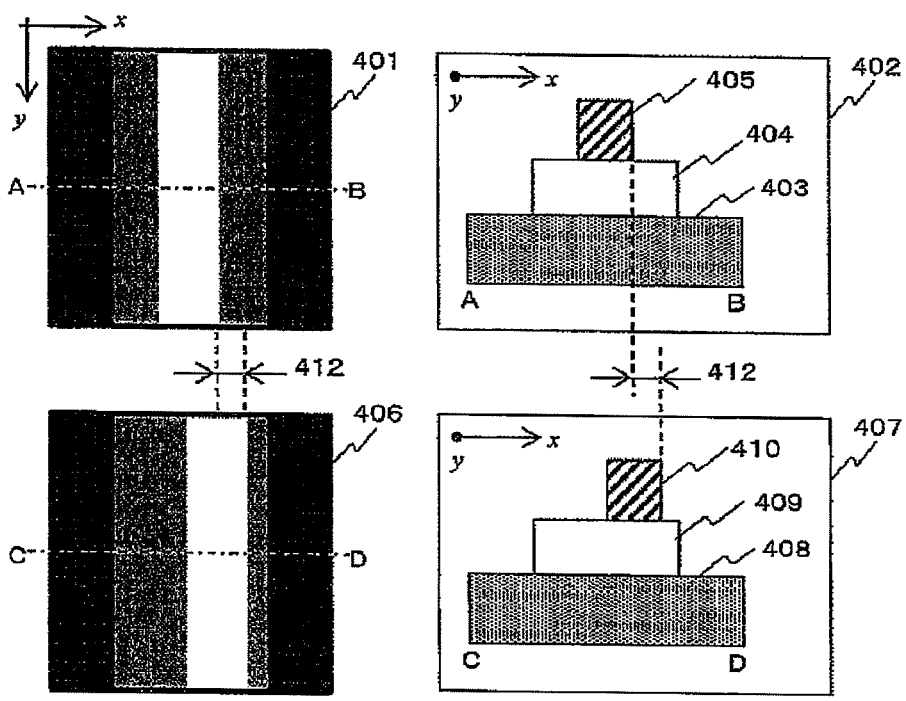
FIG. 4 is an explanatory diagram related to overlay to be measured.

FIG. 4 is an explanatory diagram for overlay to be measured. The overlay to be measured in the present invention will be described using FIG. 4.

An SEM image 401 is a schematic diagram of an SEM image captured by imaging a circuit pattern having a cross-sectional shape illustrated in 402. In the circuit patterns of this example, a circuit pattern 404 is formed on a base 403 by first exposure and after that a circuit pattern 405 is formed by second exposure.

An SEM image 406 is captured by imaging a spot different from the SEM image 401 on the semiconductor wafer. In the same manner, a circuit pattern 409 is formed on a base 408 by the first exposure and then a circuit pattern 410 is formed by the second exposure.

However, in the spot where the SEM image 406 is captured, a state can be seen in which the circuit pattern 410 formed by the second exposure is deviated in an x direction by a distance dx (412), compared with the spot where SEM image 401 is captured. According to the method according to the present embodiment, in the case where an optional image (e.g., SEM image 401) is set as the reference image and another optional image (e.g., SEM image 406) is set as the measurement target image, the overlay is measured by quantifying a difference between a position where the circuit pattern formed in the measurement target image and a position where the circuit pattern formed in the reference image for each individual circuit pattern formed by each exposure.

FIG. 4 is the case in which the overlay is measured for the second exposure when the circuit pattern formed by the first exposure is defined as the reference pattern, but it is also possible to define the circuit pattern formed by the second exposure as the reference pattern. In this case, a deviation amount is not different, but a calculated value has positive and negative signs reversed. Here, note that $n^{th}$ exposure does not necessarily indicate the exposure executed in the $n^{th}$ time, and is an index simply representing a difference of exposure processes. Accordingly, hereinafter, n is referred to as exposure index. Also, note that "circuit pattern formed by exposure" is not only limited to the circuit pattern formed by the exposure process but also indicates the circuit pattern formed by an inclusive process such as an etching process after the exposure process.

Figure 5:
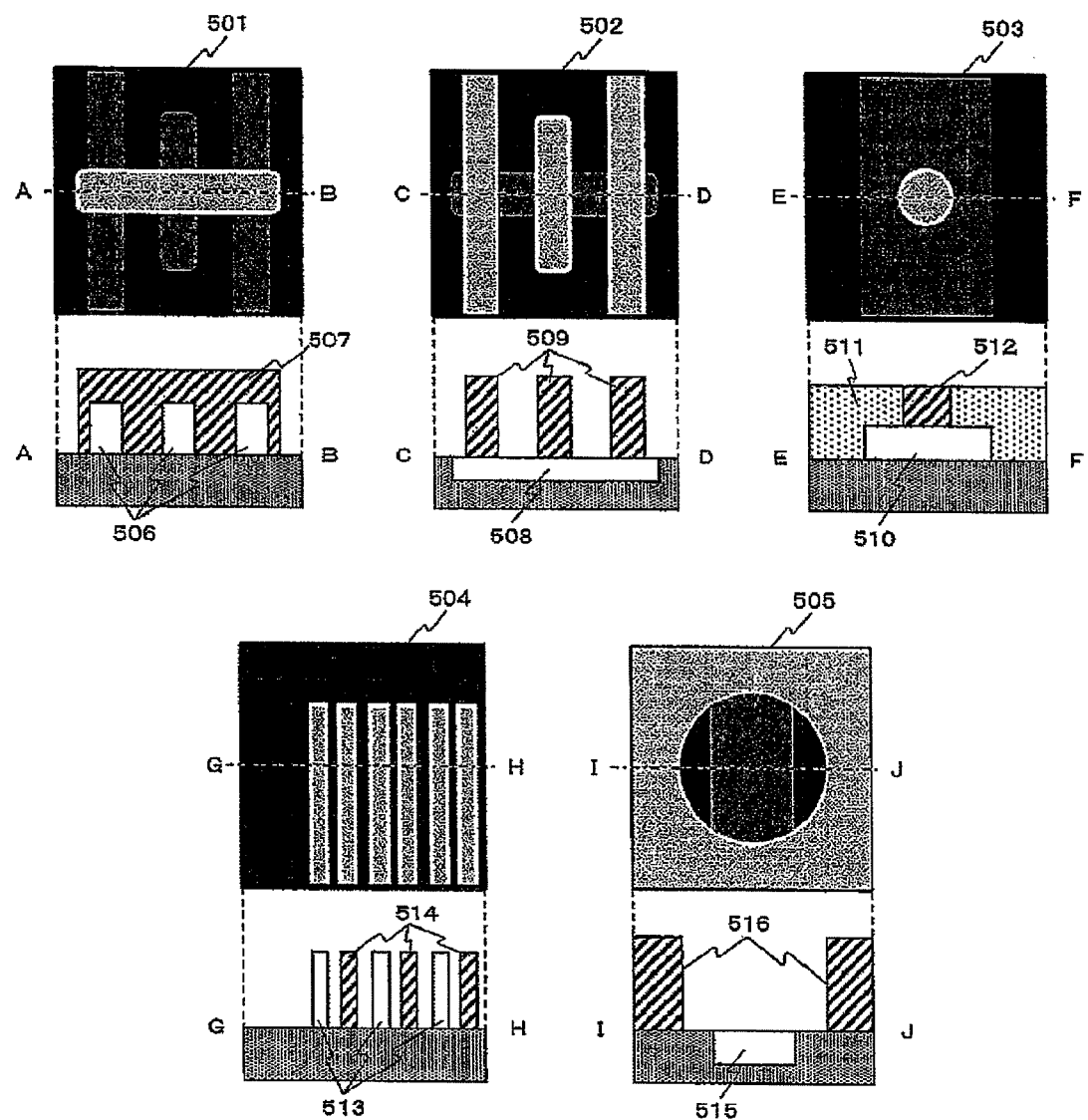
FIG. 5 is a diagram illustrating examples of an overlay measurement target image and a cross-sectional structure thereof.

FIG. 5 is a diagram illustrating examples of overlay measurement target image and a cross-sectional structure thereof. The examples of the overlay measurement target other than those illustrated in FIG. 4 will be described.

The reference sings 501 to 505 are schematic diagrams illustrating the SEM images and the cross-sectional structures.

The reference sign 501 shows a state in which circuit patterns 506 formed by the first exposure and a circuit pattern 507 formed by the second exposure are laminated.

In the same manner, the reference sign 502 shows a state in which a circuit pattern 508 formed by the first exposure and circuit patterns 509 formed by the second exposure are laminated.

Also, the reference sign 503 shows a state in which a film 511 and a circuit pattern 512 formed by the second exposure are laminated on a circuit pattern 510 formed by the first exposure. In the case where the film is thus laminated on the circuit pattern formed by the first exposure, a shape of the circuit pattern 510 formed by the first exposure can be observed by adjusting an accelerating voltage of the SEM.

The reference sign 504 indicates the circuit pattern formed by double patterning. The double patterning is a technique whereby the circuit pattern is formed with high density by forming circuit patterns 513 by the first exposure and then forming circuit patterns 514 by the second exposure.

The reference sign 505 is an image of a hole process, showing a state in which a circuit pattern 515 formed by the first exposure is observed from an hole of circuit patterns 516 formed by the second exposure.

In any of these cases, it is important to measure the overlay for the circuit patterns formed by the first exposure and the circuit pattern formed by the second exposure. Note that the configuration of the circuit pattern where the overlay measurement according to the present embodiment can be performed is not limited to the above described cases. For example, in an image observed to have the circuit patterns formed by performing exposure three times in total, it is possible to measure the overlay between the respective exposure processes.

Figure 6:
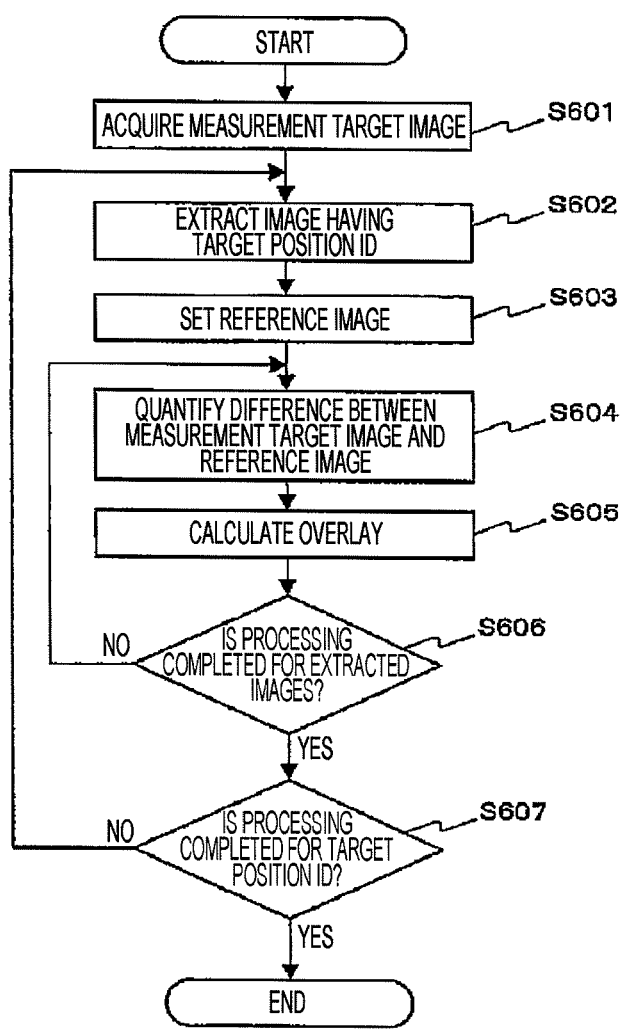
FIG. 6 is a flowchart illustrating a flow of an overlay measuring method according to the present invention.

FIG. 6 is a flowchart of the overlay measuring method according to the present invention, and FIG. 7 is a flowchart illustrating detailed flow of the image processing step for a measurement target image (S601) in the flow of the overlay measuring method according to the present invention.

First, an image (measurement target image) at a measuring spot is acquired in accordance with the flow illustrated in FIG. 7 (S601). After acquiring the measurement target image, images having the same position ID are extracted in order to execute processing per position ID (S602). The processing order for respective position IDs may be optionally set, or the processing may be executed only for an image having an ID designated by a user. Since the images extracted have the same chip coordinate, the same circuit pattern is imaged. The reference image is set based on these measurement target images (S603). The reference image may be selected by the user from among the measurement target images, or may be obtained by synthesizing the measurement target images by using the reference image synthesizing unit 208. An example of the synthesizing method may be setting an average gray value of corresponding pixels as a gray value of the synthesized image after adjusting the positions of the images. Another example is to designate an exposure index of the reference pattern at the time of setting the reference image.

After setting the reference image, the difference between the measurement target image and the reference image is quantified (S604), and the overlay is calculated based on a result of the quantification (S605). The above-described processing from S604 to S605 is repeated until the processing is completed for all of the extracted images (S606). Further, the processing from S602 to S606 is repeated until the processing is completed for the target position ID (S607). In the following, the processing in S601, S604 and S605 will be described in detail.

The processing of acquiring the measurement target image (S601) will be described using FIG. 7.

First, the wafer 108 of the measurement target is loaded on the stage 109 (S701) and a recipe corresponding to the wafer is read from the recipe storage unit 206 (S702). Next, the measuring coordinate is read from the measuring coordinate storage unit 207 (S703). After reading the coordinate (or concurrently), wafer alignment is executed (S704). After the wafer alignment, the SEM 101 is controlled by the above-described method to capture the image of the designated coordinate (S705). At this point, the position ID is assigned to the captured image as the accessory information. The processing is repeated until all imaging is completed (S706), and finally the wafer is unloaded (S707).

Figure 9:
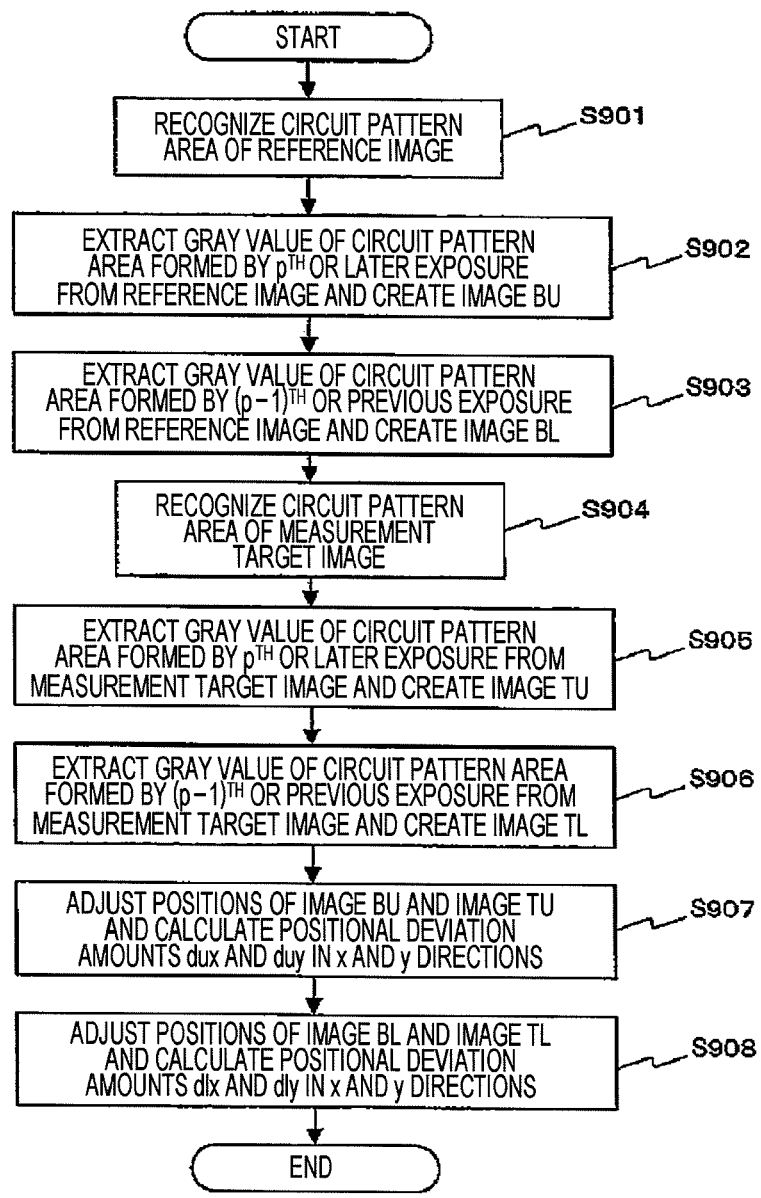
FIG. 9 is a flowchart illustrating processing of quantifying a difference between a reference image and a measurement target image.
Figure 10:
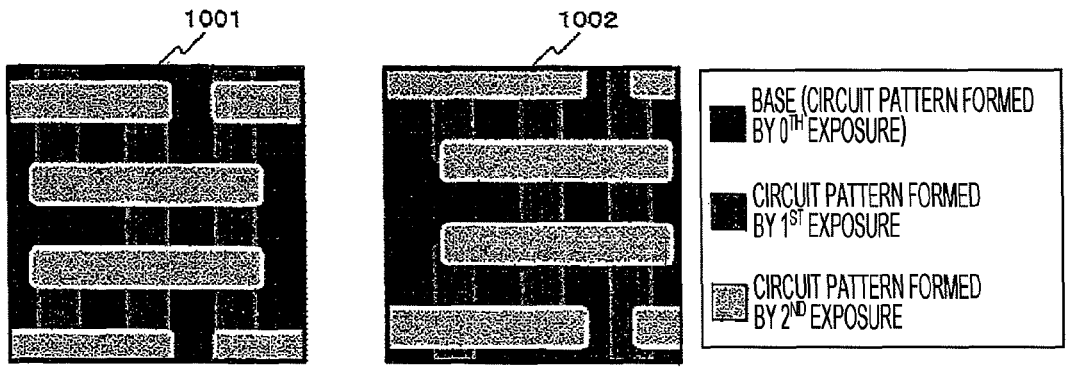
FIG. 10 is a diagram illustrating examples of the overlay measurement target image.
Figure 11:
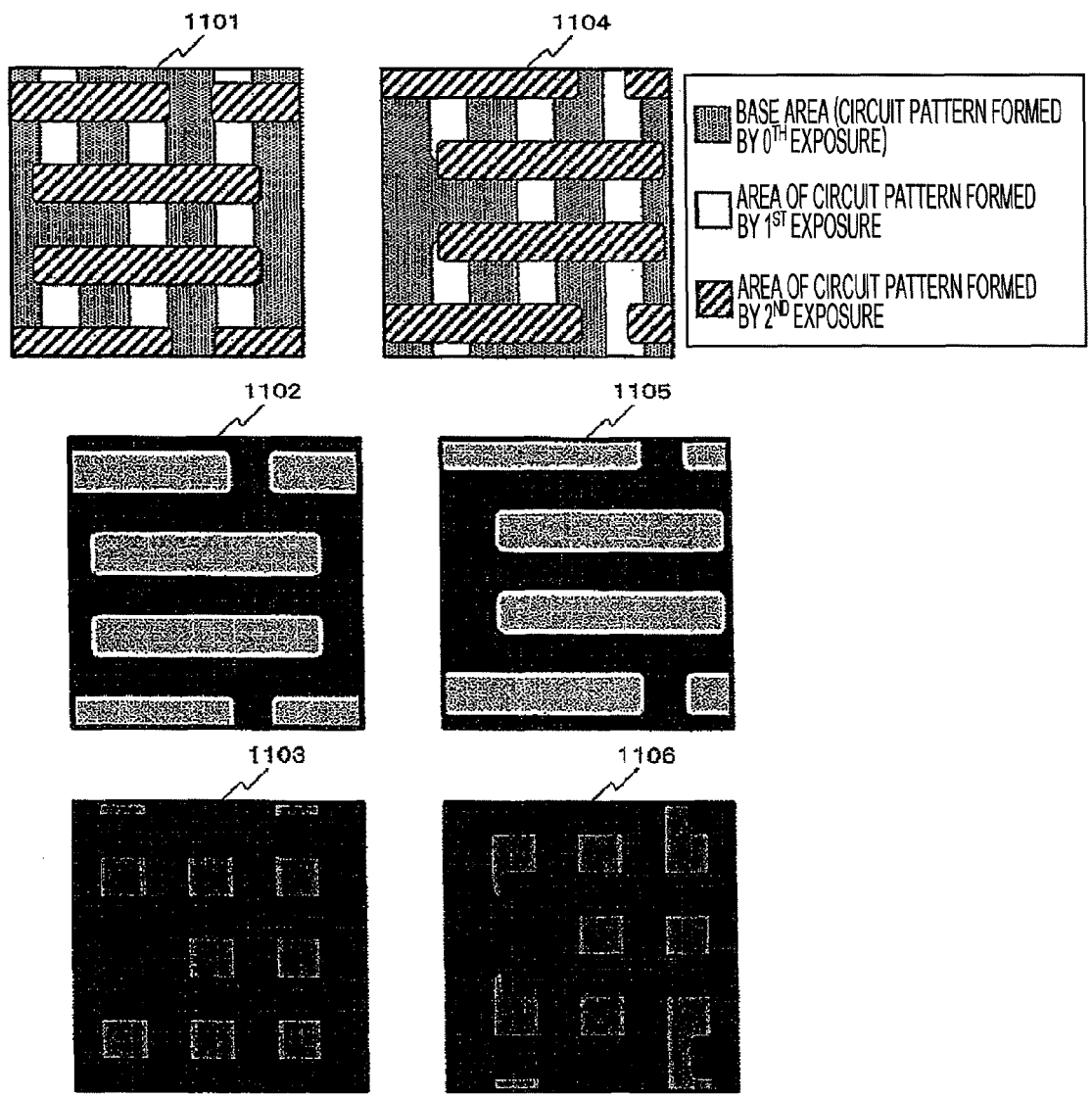
FIG. 11 is a diagram illustrating halfway results of the processing of quantifying a difference between the reference image and the measurement target image.
Figure 12:
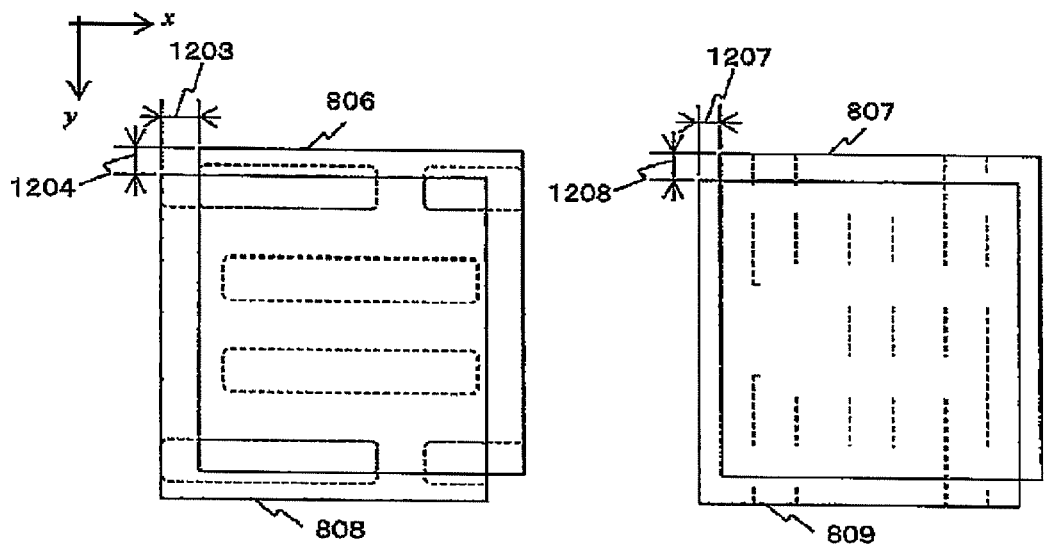
FIG. 12 is a diagram illustrating halfway results of the processing of quantifying the difference between the reference image and the measurement target image.

Next, the processing of quantifying the difference between the measurement target image and the reference image (S604) will be described using FIGS. 9 to 12. FIG. 9 is a flowchart illustrating the processing of quantifying the difference between a reference image and a measurement target image, FIG. 10 is a diagram illustrating examples of the overlay measurement target image, and FIGS. 11 and 12 are diagrams illustrating halfway results of the processing of quantifying the difference between the reference image and the measurement target image.

This processing is executed using the image difference quantifying unit 209. The reference sign 801 in FIG. 8 indicates the configuration of the image difference quantifying unit according to the present embodiment, and corresponds to the reference sign 209 in FIG. 2. FIG. 9 is the flowchart illustrating the flow of the processing of quantifying the difference between a reference image and a measurement target image by using the image difference quantifying unit 209. In this processing, the reference image is defined as input 802, and the measurement target image is defined as input 803. Hereinafter, a reference image 1001 and a measurement target image 1002 illustrated in FIG. 10 are used as exemplary images for description.

First, a circuit pattern area formed by each exposure is recognized for the reference image by using a circuit pattern area recognizing unit 804 (S901). FIG. 11 is a diagram illustrating exemplary processing results: an image 1101 is an example of the recognition result of the circuit pattern area in the reference image 1001. Next, based on the recognition results of the circuit pattern area, a gray value extracting unit 805 is used to create an image BU (806) having extracted a gray value of the circuit pattern area formed by $p^{th}$ or later exposure from the reference image (S902) and also create an image BL (807) having extracted a gray value of the circuit pattern area formed by $(p-1)^{th}$ or previous exposure from the reference image (S903). Examples of the image BU and image BL are illustrated in an image 1102 and an image 1103 respectively.

The recognition of the circuit pattern area is executed for the measurement target image in the same manner (S905), and an image TU (808) having extracted a gray value of the circuit pattern area formed by the $p^{th}$ or later exposure from the measurement target image is created, (S905), and an image TL (809) having extracted a gray value of the circuit pattern formed by the $(p-1)^{th}$ or pervious exposure from the measurement target image is created (S906). Note that p is a parameter designated by the user and also is a threshold at the time of splitting the circuit pattern by the exposure index. For example, in the case where p is equal to 3, the overlay between the circuit pattern formed by the $3^{rd}$ or later exposure and the circuit pattern formed by the $2^{nd}$ or previous is measured.

An example of the recognition result of the circuit pattern area in the measurement target image is illustrated in an image 1104, and examples of the image TU and the image TL are illustrated in an image 1105 and an image 1106 respectively. Next, position adjustment is executed for the image BU (806) and image TU (808) by using a template matching unit 810, and an x-direction deviation amount dux (812) and a y-direction deviation amount duy (813) are output (S907). In the same manner, the position adjustment is executed for the image BL (807) and the image TL (809), and an x-direction deviation amount dlx (814) and a y-direction deviation amount dly (815) are output (S908).

FIG. 12 is a diagram illustrating exemplary results of the template matching, where the deviation amounts dux and duy respectively correspond to the reference signs 1203 and 1204, and the deviation amounts dlx and dly respectively correspond to the reference signs 1207 and 1208. Meanwhile, in the case where the circuit patterns having the same shape are repeatedly formed like a memory cell unit, there are multiple matching places. Therefore, when template matching for the image BU and image TU and template matching for the image BL and image TL are individually executed, there may be a case mismatch occurs. To avoid such a problem, it is preferable to preliminarily execute the position adjustment roughly for the reference image and measurement target image by using the template matching unit 819, and then execute template matching around a matching position 820 by the template matching unit 810.

The method of splitting the circuit pattern into two groups based on the exposure time p has been described above, but it is also possible to individually calculate the positional deviation amounts between a qualified image and the measurement target image with respect to $1^{st}$ to $m^{th}$ exposure patterns.

Next, overlay calculation processing (S605) will be described. This processing is executed using the overlay calculation unit 210. The overlay calculation unit 811 in FIG. 8 illustrates the configuration of the overlay calculation unit 210 according to the present embodiment in FIG. 2. In this processing, the deviation amount (dux 812, duy 814) of the circuit pattern formed by the $p^{th}$ or later exposure, which is an output from the image difference quantifying unit, and the deviation amount (dlx 813, dly 815) of the circuit pattern formed by the $(p-1)^{th}$ or previous exposure are input. In this processing, the x-direction overlay dx (817) is calculated by Mathematical Formula 2, and the y-direction overlay dy (818) is calculated by Mathematical Formula 3, using the subtraction unit 816. Meanwhile, the above-described method is the calculation method in the case where the circuit pattern formed by the $(p-1)^{th}$ or previous exposure is defined as the reference pattern. In the case where the circuit pattern formed by the $p^{th}$ or later exposure is defined as the reference pattern, it is only to reverse positive and negative signs of the values calculated by Formulae 2 and 3.

$$dx = dux - dlx \quad \text{(Mathematical Formula 2)}$$

$$dy = duy - dly \quad \text{(Mathematical Formula 3)}$$

Now, the recognition processing at the circuit pattern area recognizing unit 804 will be described. The semiconductor manufacturing includes a number of processes, and appearance of the images obtained by the difference of the processes or products is varied. The easiest case to recognize the circuit pattern area is when the gray value of the circuit pattern area is varied by each exposure process by which the circuit pattern is formed. More specifically, in the case where the circuit pattern formed by the first exposure and the circuit pattern formed by the second exposure are formed of different material, the number of generated secondary electrons and the number of the reflected electrons are different, thereby causing difference in the gray values. Also, in the case where the circuit pattern formed by the second exposure is laminated on the circuit pattern formed by the first exposure, difference in the gray value may be caused by the difference of detection rate of the generated secondary electrons or the reflected electrons.

Figure 13:
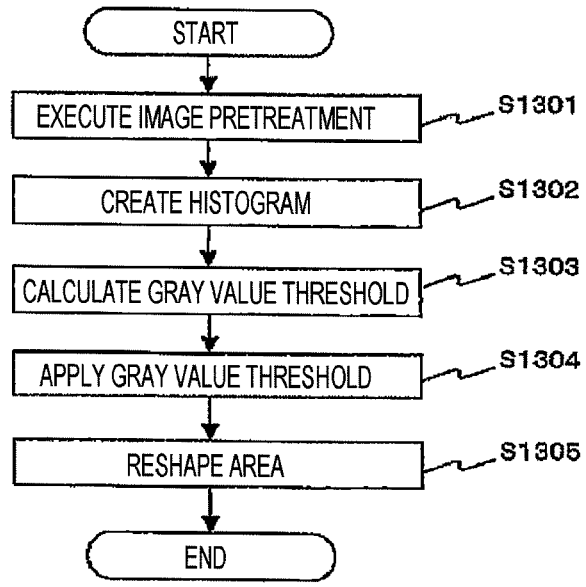
FIG. 13 is a flowchart illustrating processing of recognizing a circuit pattern area from an image.
Figure 14:
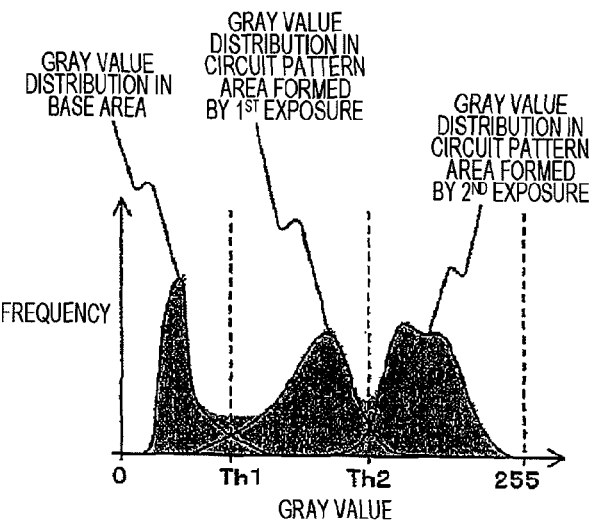
FIG. 14 is a diagram illustrating an exemplary image histogram.

FIG. 13 is a flowchart illustrating the processing of recognizing a circuit pattern area of an image having a gray value varied by each exposure process by which the circuit pattern is formed. First, pretreatment such as denoising is applied to the image (S1301). Next, a histogram of the image is created (S1302). In the created histogram, a plurality of distributions corresponding to the exposure indexes is observed in a mixed manner, as illustrated in FIG. 14. Based on this histogram, a threshold to split the respective distributions is calculated (S1303). Next, a gray value threshold is Applied to each of pixels in the image, and an exposure index per pixel is recognized (S1304). After applying the threshold to each of the individual pixels, an area slightly erroneously recognized may be generated due to noise and the like. To avoid this, processing such as expansion/degeneration is executed for reshaping the area (S1305).

However, note that the method for recognizing the circuit pattern area is not limited to the flow illustrated in FIG. 13. For instance, an edge of the image may be detected to quantify appearance feature of a closed area surrounded by the edge, so that an exposure index may be recognized for each closed area based on the appearance feature.

Next, the processing in the template matching units 810 and 819 will be described. In this processing, a matching degree of image contrasting density of two images in an overlapping area is evaluated, gradually changing the deviation amount between the two images, and when the matching degree of the image becomes maximal, the deviation amount is output. As an evaluation value of the matching degree, a normalized cross-correlation value or a square sum of the difference may be adopted, for example.

In the following, the user interfaces according to the present invention will be described.

Figure 15:
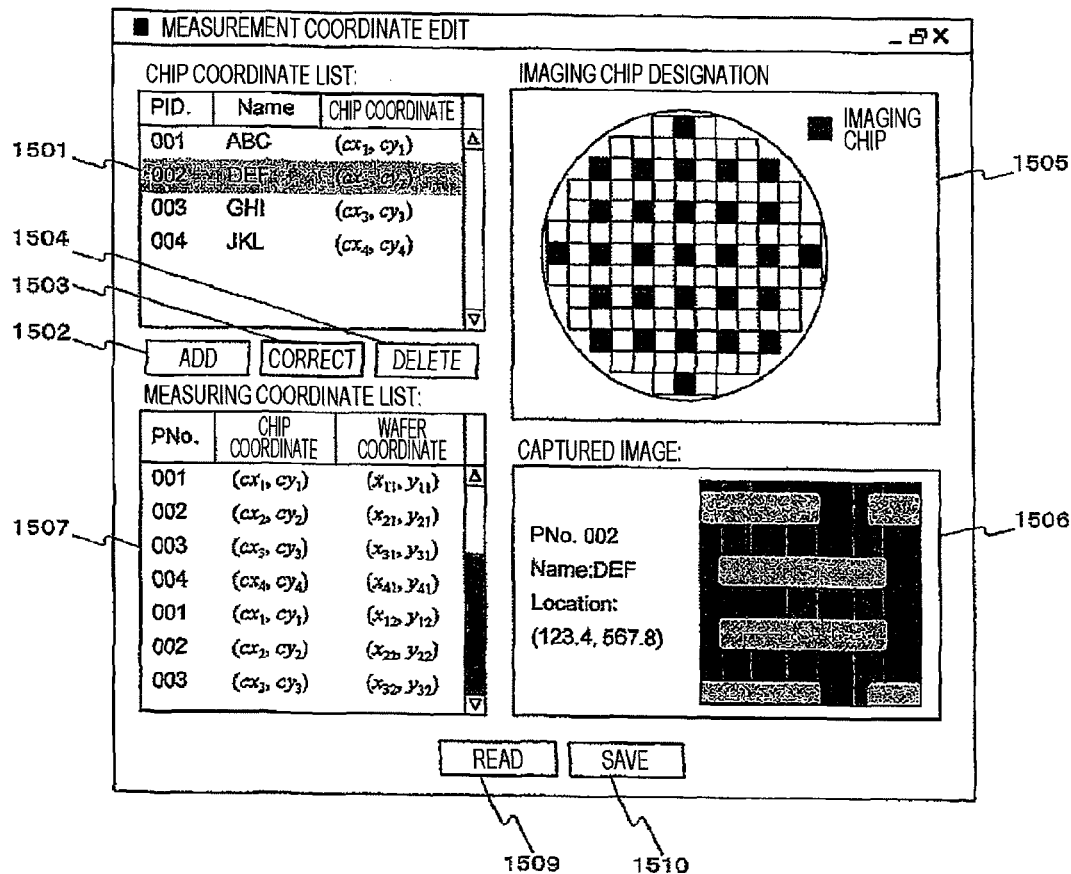
FIG. 15 is a diagram illustrating an exemplary interface for setting a measuring coordinate.

FIG. 15 is a diagram illustrating an exemplary interface for setting a measuring coordinate.

This interface includes an interface 1501 for displaying a list of registered chip coordinates, a button 1502 to call an interface for registering a new chip coordinate, and a button 1503 to call an interface for correcting the registered chip coordinate, and a button 1504 to delete the registered chip coordinate. Additionally, the interface includes an interface 1505 for selecting a measurement target chip, an interface 1506 for displaying an image of the registered measuring coordinate and information related thereto, and an interface 1507 for displaying a list of the measuring coordinates to be imaged. Moreover, the interface includes a button 1509 to read the list of the registered measuring coordinates and a button 1510 to name and store the list of the registered measuring coordinates.

An exemplary interface for setting overlay measuring conditions according to the present embodiment will be described.

Figure 16:
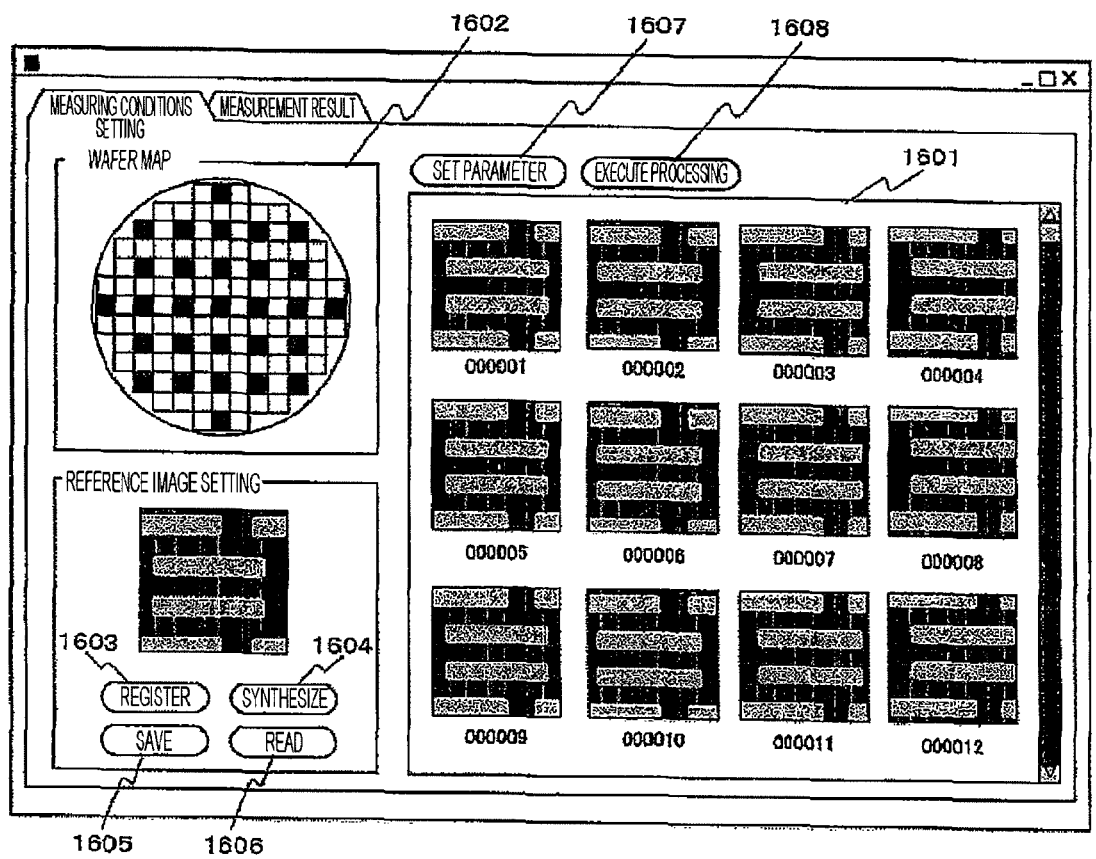
FIG. 16 is a diagram illustrating an exemplary interface for setting set measuring conditions.

FIG. 16 is a diagram illustrating an exemplary interface for setting the measuring conditions.

This interface includes an interface 1601 for displaying a list of acquired images, an interface 1602 for displaying a position of the chip having captured an image, a button 1603 to set a selected image as the reference image, a button 1604 to call the processing to synthesize the reference image based on a plurality of images selected at the interface 1601 or all of the images having been captured, a button 1605 to store the set reference image in the image storage unit 205, and a button 1606 to read the image from the image storage unit 205 and set the read image as the reference image. Further, the interface includes a button 1607 to set the processing parameters, and a button 1608 to execute the above-described processing from S602 to S607 for the captured measurement target image.

Figure 17:
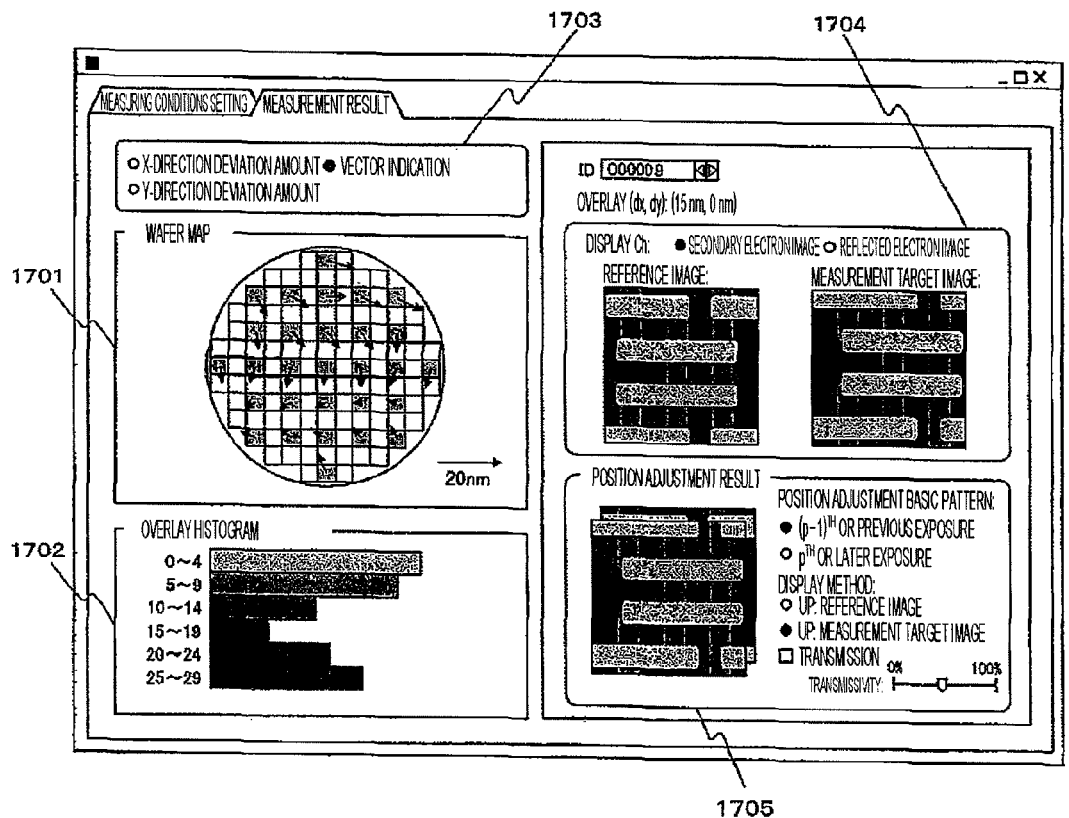
FIG. 17 is a diagram illustrating an exemplary interface for displaying measurement results.

FIG. 17 is a diagram illustrating an exemplary interface for displaying overlay measurement results according to the present embodiment.

This interface includes an interface 1701 for displaying the overlay measurement results superimposed on the wafer, an interface 1702 for displaying a histogram as for the overlay size, and an interface 1703 for designating the measurement result to be displayed on the wafer map or the histogram. Additionally, the interface includes an interface 1704 for displaying the reference image and the measurement target image next to each other as an interface for checking the images, and an interface 1705 for displaying the reference image and the measurement target image in a superimposing manner after being placed on a designated reference position.

Figure 32:
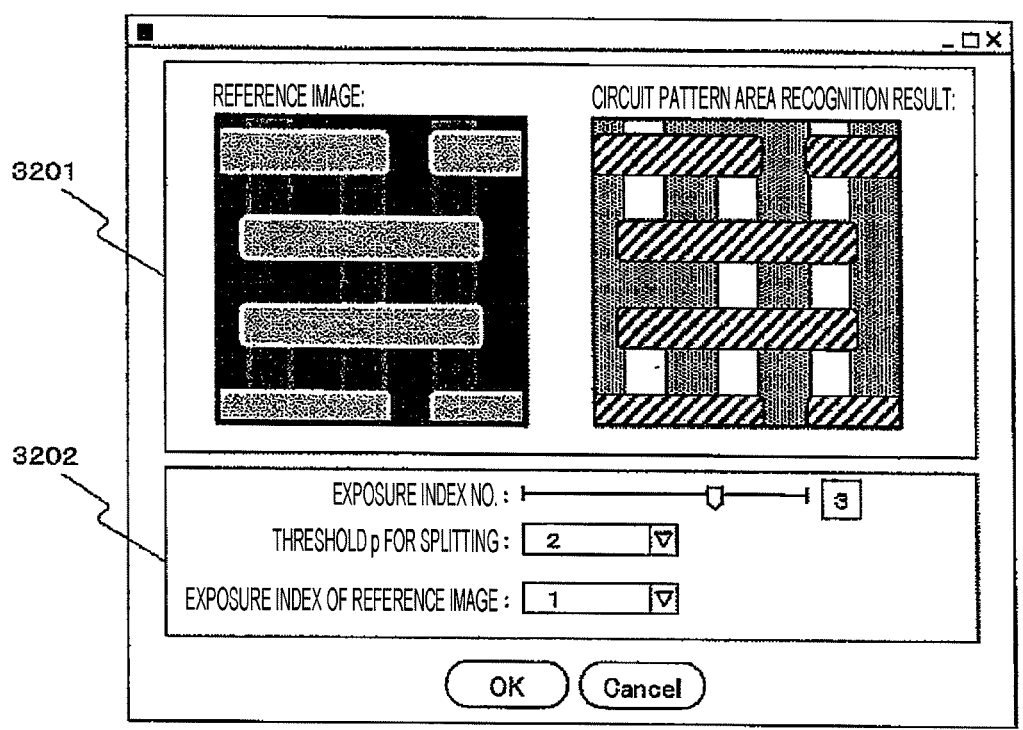
FIG. 32 is a diagram illustrating an exemplary interface for adjusting processing parameters.

FIG. 32 is a diagram illustrating an exemplary interface for adjusting the processing parameters according to the present embodiment.

This interface includes an interface 3201 for displaying the recognition results of the reference image and the circuit pattern area, and an interface 3202 for designating a maximum value of the exposure index to be observed inside the image, a threshold p at the time of splitting the circuit pattern by the exposure index, and an exposure index of the reference pattern.

As described above, the positional deviation amount of the circuit pattern between the reference image and the measurement target image is quantified for each circuit pattern formed by each exposure to calculate the difference of the positional deviation amount calculated for each circuit pattern formed by each exposure, thereby achieving to measure the overlay in the actual patterns. Therefore, unlike the method disclosed in PTL 1, a pattern dedicated for overlay measurement is not necessary to be formed on the wafer. Further, according to the method recited in the present embodiment, it is not necessary to use the CAD data unlike the method disclosed in PTL 2, and therefore the overlay measurement can be simply executed. Furthermore, since the position adjustment for the reference image and the measurement target image is executed by the template matching, the present method is robust to deformation and the like of the circuit pattern caused by defective formation, compared to a method in which coordinate relative vectors are compared like the method disclosed in PTL 3.

Second Embodiment

According to the first embodiment, a method in which overlay is measure by recognizing a circuit pattern area for each of a reference image and a measurement target image and quantifying a positional deviation amount for each circuit pattern formed by each exposure has been described. According to a second embodiment, a method in which the overlay is measured by recognizing the circuit pattern area only for the reference image and quantifying the positional deviation amount per each circuit pattern formed by each exposure will be described.

A configuration of an apparatus according to the present embodiment is same as those illustrated in FIGS. 1 and 2. Also, measurement flows are same as those illustrated in FIGS. 6 and 7. Further, interfaces are also same as those illustrated in FIGS. 15, 16 and 17. Matters different are a configuration of an image difference quantifying unit 209 (corresponding to 801 in FIG. 8) and a flow of image difference quantifying processing. In the following, only the matters different from the first embodiment will be described using FIGS. 18 to 21.

Figure 18:
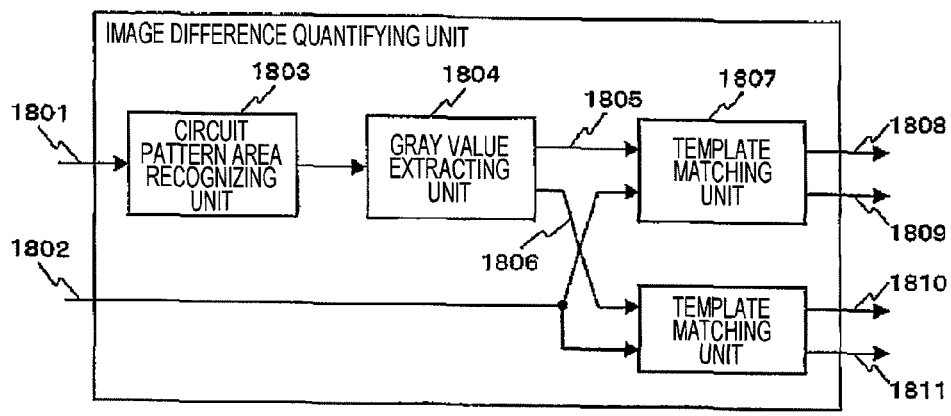
FIG. 18 is a diagram illustrating a configuration of an image difference quantifying unit according to the present invention.
Figure 19:
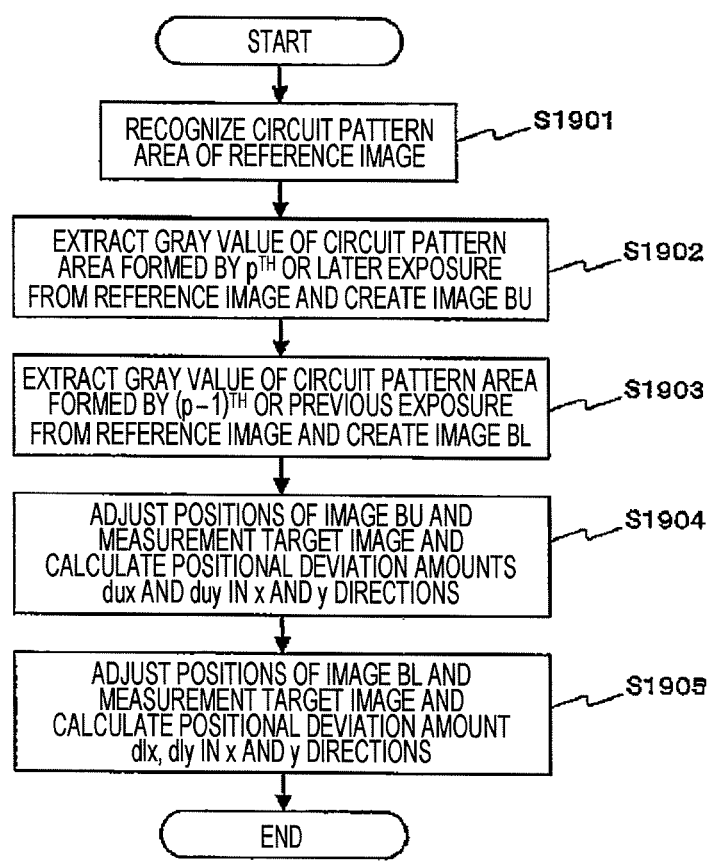
FIG. 19 is a flowchart illustrating processing of quantifying the difference between the reference image and the measurement target image according to the present invention.
Figure 20:
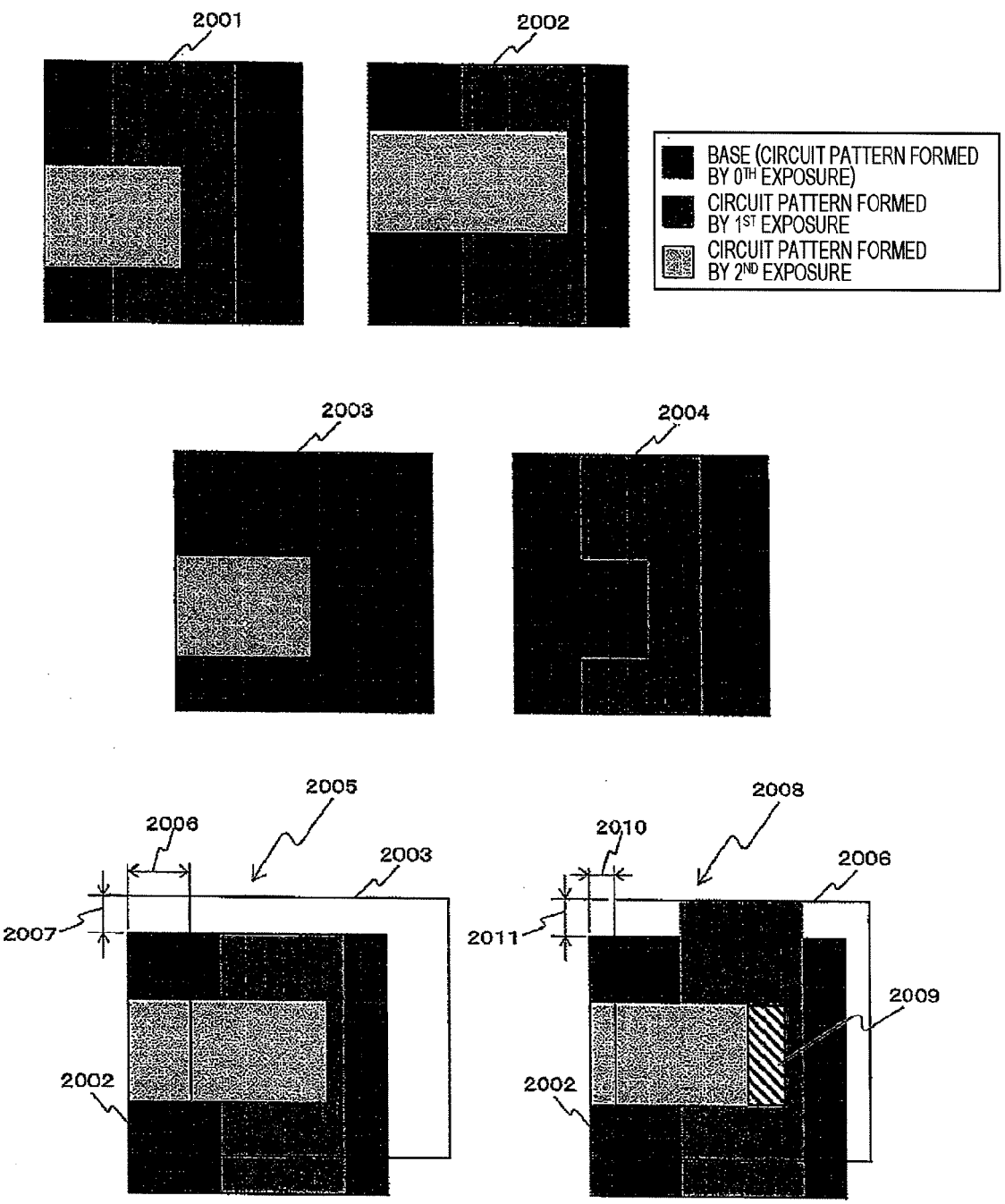
FIG. 20 is a diagram illustrating halfway results of the processing of quantifying the difference between the reference image and the measurement target image.
Figure 21:
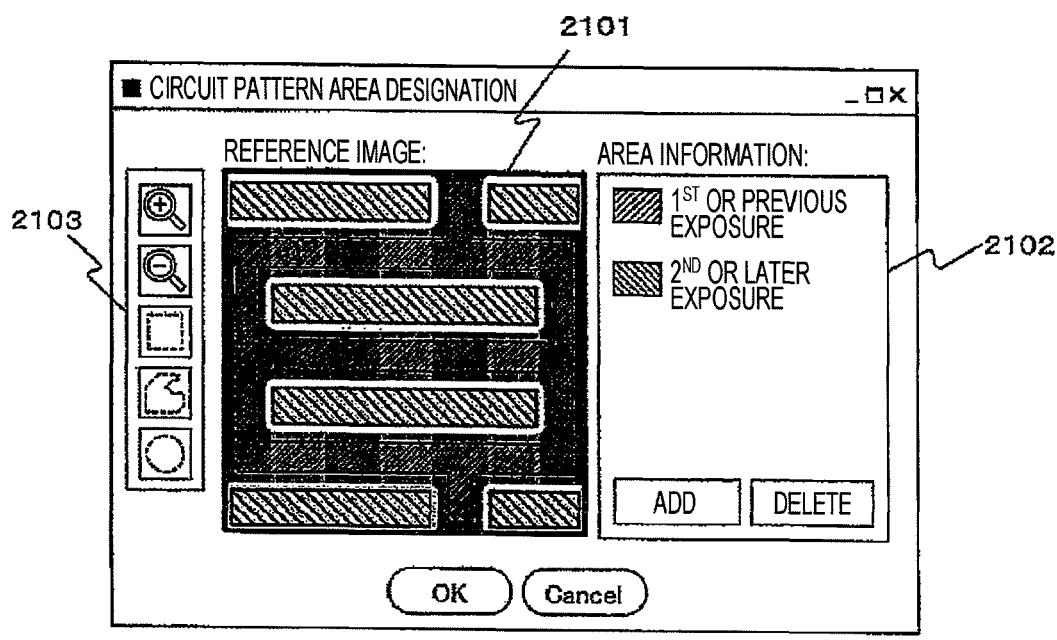
FIG. 21 is a diagram illustrating an exemplary interface for designating a circuit pattern area.

FIG. 18 is a diagram illustrating a configuration of an image difference quantifying unit according to the present invention, FIG. 19 is a flowchart illustrating processing of quantifying a difference between the reference image and the measurement target image according to the present invention, FIG. 20 is a diagram illustrating halfway results of the processing of quantifying the difference between the reference image and the measurement target image, and FIG. 21 is a diagram illustrating an exemplary interface for designating a circuit pattern area.

As described above, the overlay measuring method according to the second embodiment has the method for quantifying the difference between the reference image and the measurement target image different from that according to the first embodiment. A configuration of the image difference quantifying unit 209 according to the second embodiment is illustrated in FIG. 18 and the flow of the processing is illustrated in FIG. 19. In this processing, the reference image is defined as an input 1801, and the measurement target image is defined as an input 1802. First, a circuit pattern area formed by each exposure is recognized for the reference image by using a circuit pattern area recognizing unit 1803 (S1901). Next, based on the recognition result of the circuit pattern area, a gray value extracting unit 1804 is used to create an image BU (1805) having extracted a gray value of the circuit pattern area formed by $p^{th}$ or later exposure from the reference image (S1902), and also create an image BL (1806) having extracted a gray value of the circuit pattern area formed by $(p-1)^{th}$ or previous exposure from the reference image (S1903). Note that p is a threshold at the time of splitting the circuit pattern by an exposure index, and may be a parameter designated by a user or predetermined. After extraction of the gray value, position adjustment for the image BU (1805) and the measurement target image (1802) is executed using a template matching unit 1807, and an x-direction deviation amount dux (1808) and a y-direction deviation amount duy (1809) are output (S1904). In the same manner, position adjustment is executed for the image BL (1806) and the measurement target image (1802), and an x-direction deviation amount dlx (1810) and a y-direction deviation amount dly (1811) are output (S1905). A supplemental description will be provided using the exemplary results of the processing illustrated in FIG. 20. An image 2001 is a diagram schematically illustrating an exemplary reference image, and an image 2002 is a diagram schematically illustrating an exemplary measurement target image. Note that the images are obtained by capturing a configuration where a circuit pattern formed by a second exposure is laminated on a circuit pattern formed by first exposure, as illustrated in FIG. 4. Images 2003 and 2004 are diagrams illustrating the image BU and image BL in the case where p is equal to 2. An image 2005 is a diagram illustrating a result of position adjustment executed by template matching for the measurement target image (2002) and the image BU (2003), and the deviation amounts dux and duy correspond to the reference signs 2006 and 2007 respectively. An image 2008 is a diagram illustrating a result of position adjustment executed by template matching for the measurement target image (2002) and the image BL (2004). At this point, an area 2009 having unmatched contrasting density of the image may be generated because the measurement target image (2002) includes the contrasting density of a circuit pattern area formed by $p^{th}$ or later exposure as well. However, in the case where a proportion of such an area is small, position adjustment can be executed correctly and the deviation amounts dlx and dly result as the reference signs 2010 and 2011.

According to the present embodiment, recognition of the circuit pattern area from the measurement target image is not executed. Also, recognition of the circuit pattern area of the reference image is not necessarily executed every time a plurality of measurement target images is processed, and therefore it may be preferred to have recognized results stored in an image storage unit 205 so as to be read out when necessary. This can save the time required for recognizing the circuit pattern area and shorten a measuring time as well.

Further, recognition of the circuit pattern area of the reference image is not necessarily executed automatically, and therefore the user can designate the circuit pattern area formed by each exposure. An exemplary interface for designating the area is illustrated in FIG. 21. This interface includes an interface 2101 for displaying the reference image set in S603, an interface 2102 for adding/deleting area information, and various tool buttons 2103 to define the area. With this configuration, it is possible to handle even a case where appearances of the circuit patterns formed by the first and second exposure are so similar that it is hard to differentiate by the circuit pattern recognition processing, like double patterning, for example.

According to the above-described method and the configuration of the apparatus, the overlay can be measured at a high speed, besides the effects described in the first embodiment.

Third Embodiment

According to the first and second embodiments, overlay measuring methods in which the overlay is measured recognizing a circuit pattern area from a reference image as well as a measurement target image and a positional deviation amount is quantified for each circuit pattern formed by each exposure has been described. According to a third embodiment, a method in which the overlay is measured by quantifying a difference of a gray value in an image between the reference image and the measurement target image will be described.

According to this method, a pixel size is enlarged by widening a visual field of the image. Accordingly, the method is effective in the case where it is hard to automatically recognize the circuit pattern area.

A configuration of an apparatus according to the present embodiment is same as FIG. 1. Also, a measurement flow is same as those illustrated in FIGS. 6 and 7. Further, interfaces are also same as those illustrated in FIGS. 15 and 16. Compared to the first embodiment, the present embodiment has differences in a configuration of an image difference quantifying unit 209, a configuration of overlay calculation unit 210, a flow of quantifying the difference between the measurement target image and the reference image (S604) and a flow of overlay calculation processing (S605). In the following, only the matters different from the first embodiment will be described using FIGS. 22 to 30.

Figure 24:
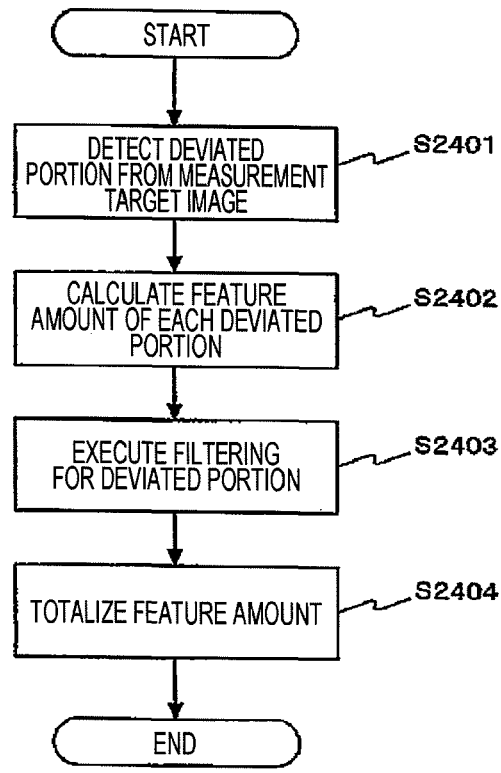
FIG. 24 is a flowchart illustrating processing of quantifying the difference between the reference image and the measurement target image according to the present invention.

FIG. 22 is a diagram illustrating a configuration of a storage unit 103 and an arithmetic unit 104 of the overlay measuring apparatus according to the present invention, FIG. 23 is a diagram illustrating a configuration of an image difference quantifying unit and an overlay calculation unit according to the present invention, and FIG. 24 is a flowchart illustrating processing of quantifying the difference between the reference image and the measurement target image (S604) according to the present invention.

The storage unit 103 and arithmetic unit 104 of the overlay measuring apparatus in FIG. 22 include a regression model storage unit 2201 and a regression model calculation unit 2202 in addition to components according to the first embodiment.

In the processing of quantifying the difference between the reference image and the measurement target image (S604) illustrated in FIG. 24, the reference image is defined as an input 2302, and the measurement target image is defined as an input 2303. First, a deviated portion is detected from the measurement target image by performing a comparative check with the reference image (S2401) using a deviated portion detecting unit 2304. A method of the comparative check is, for example, calculating a difference of a gray value after executing position adjustment for the reference image and the measurement target image and detecting an area including a pixel having a value of the difference equal to or larger than a predetermined value as the deviated portion. After detecting the deviated portion, appearance features of the deviated portion are quantified using a deviated portion feature amount calculation unit 2305 (S2402). The appearance features to be quantified are, for example, an area of the deviated portion, roundness, an average value of the gray value, and an average difference of contrasting density between the reference image and the measurement target image. Next, only a deviated portion having a feature that matches specified conditions is extracted from among extracted deviated portions, using the deviated portion filtering unit 2306 (S2403). Finally, a feature amount of the deviated portion extracted by the processing in S2403 is totalized by a feature amount totalizing unit 2307 (S2404). A method of totalizing is, for example, calculating an average of the feature amounts obtained from a plurality of the deviated portions, or calculating a maximum value, a minimum value, and so on.

The overlay calculation processing (S605) using an overlay calculation unit 2308 according to the present embodiment will be described. The configuration of the overlay calculation unit 2308 is illustrated in FIG. 23. According to this processing, a feature amount 2309 calculated from the deviated portion detected from the measurement target image is defined as an input. According to this processing, the feature amount is substituted in a regression model preliminarily acquired by a method described below using a regression model substituting unit 2310 to calculate x-direction overlay 2311 and y-direction overlay 2312.

Figure 25:
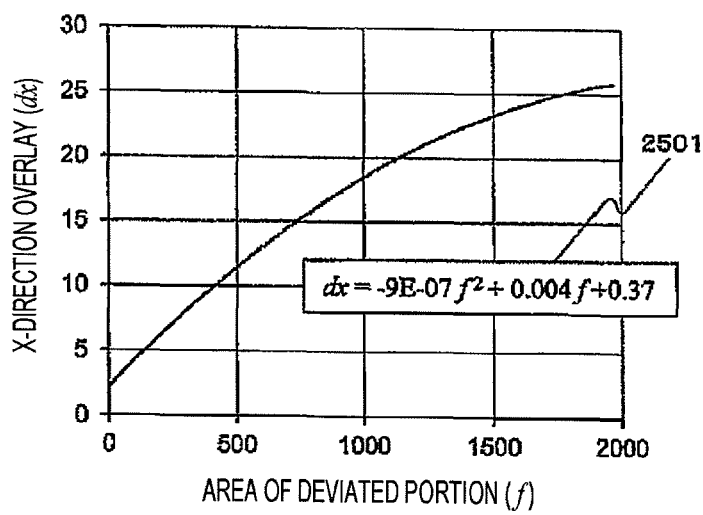
FIG. 25 is a diagram illustrating an exemplary regression model.

FIG. 25 is a diagram illustrating an exemplary regression model indicating a relation between an area of the deviated portion f and the X-direction overlay (dx). The feature amount 2309 is substituted in f of the regression model 2501, thereby calculating the x-direction overlay 2311. Meanwhile, the regression model related to the X-direction overlay is here, but the Y-direction overlay 2312 can be calculated in the case where the regression model related to the Y-direction overlay is used.

Next, a method for creating the regression model will be described.

Figure 26:
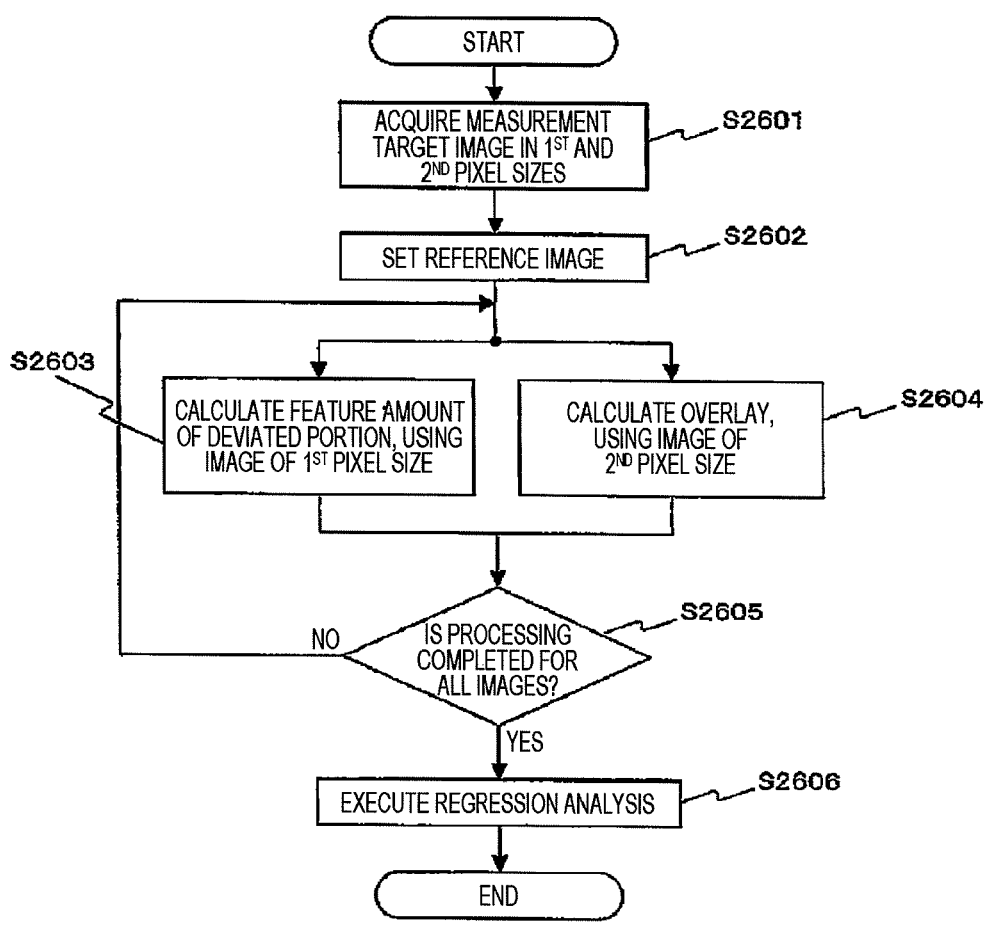
FIG. 26 is a flowchart illustrating processing of creating the regression model.
Figure 27:
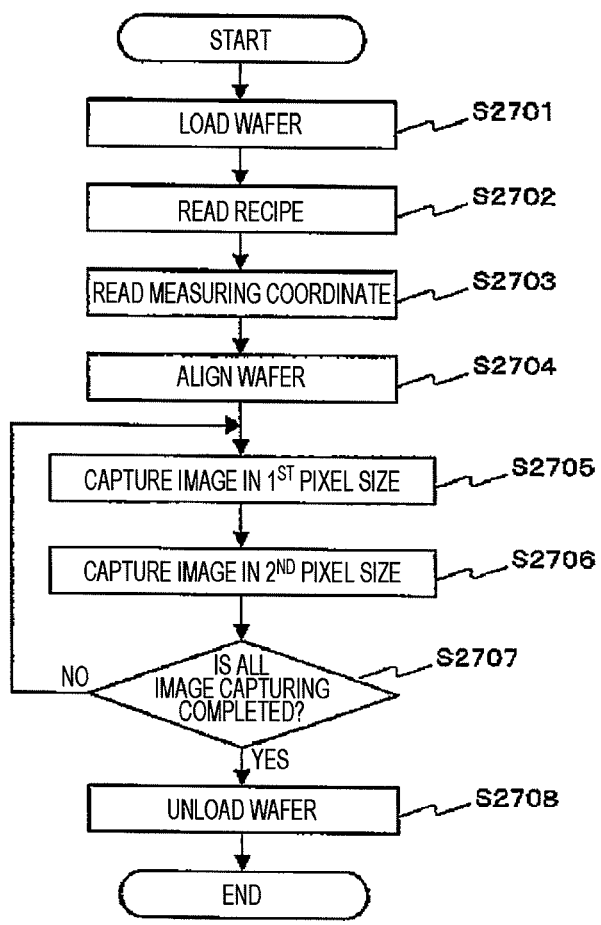
FIG. 27 is a flowchart of processing of capturing an image used for creating the regression model.
Figure 28:
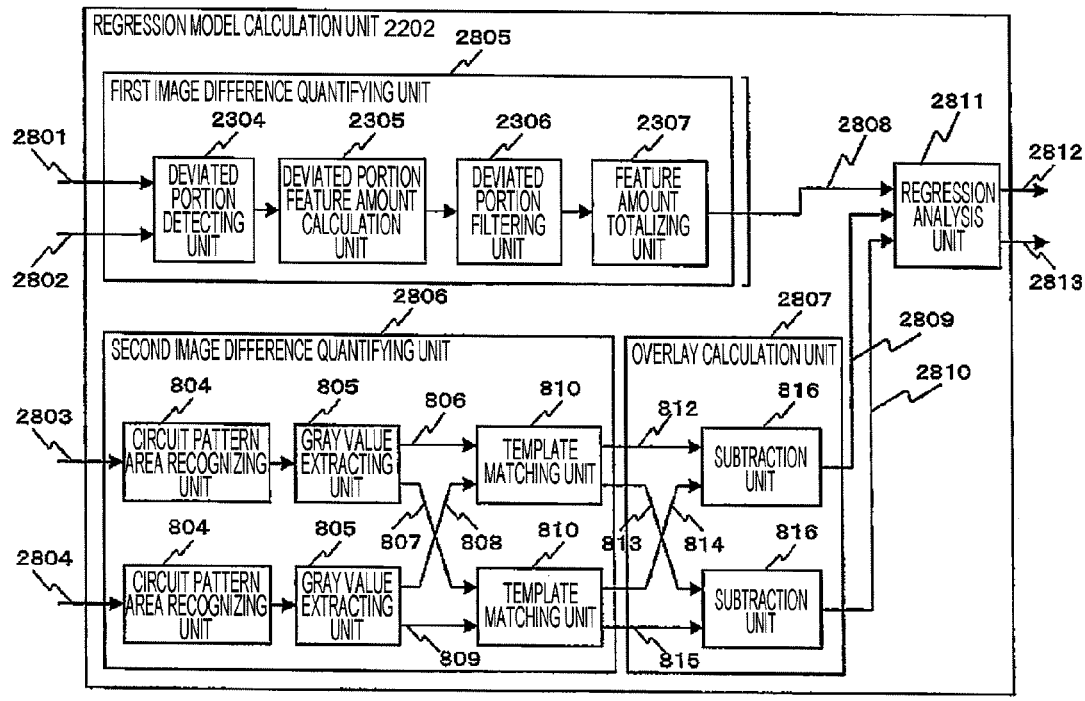
FIG. 28 is a diagram illustrating a configuration of a regression model calculation unit according to the present invention.

FIG. 26 is a flowchart illustrating the processing of creating the regression model, FIG. 27 is a flowchart of processing of image capturing used for creating the regression model, and FIG. 28 is a diagram illustrating a configuration of the regression model calculation unit 2202 according to the present invention.

Hereinafter, a procedure of the processing will be described along FIG. 26. First, images obtained by imaging a measuring coordinate in a first pixel size and a second pixel size are acquired in accordance with the flow of the image capturing illustrated in FIG. 27 (S2601). In this instance, assume that the first pixel size is larger than the second pixel size. Next, the reference image is set (S2602). The reference image may be selected from among the measurement target images by a user, or the reference image may be synthesized from the measurement target image by using reference image synthesizing unit 208. Next, the feature amount of the deviated portion is calculated by using an image of the first pixel size (S2603). Further, the overlay is measured by using an image of the second pixel size (S2604). The above processing in S2603 and S2604 is repeated until the processing is completed for all of the images (S2605). Next, the regression model is created by regression analysis (S2606). In the following, the processing in S2601, S2603, S2604, and S2606 will be described in detail.

The processing of acquiring the measurement target image in the first and second pixel sizes (S2601) will be described in detail, using the flowchart of FIG. 27.

First, a wafer 108 of a measuring target is loaded on a stage 109 (S2701), and a recipe corresponding to the wafer is read from a recipe storage unit 206 (S2702). Next, a measuring coordinate is read from a measuring coordinate storage unit 207 (S2703). After reading the coordinate (or concurrently), wafer alignment is executed (S2704). After executing wafer alignment, an SEM 101 is controlled to capture the image of a designated coordinate in the first pixel size (S2705). Next, the image of the same coordinate is captured in the second pixel size (S2706). At this point, a position ID is assigned to each of the captured images as accessory information. The processing is repeated until all imaging is completed (S2707), and finally the wafer is unloaded (S2708). Meanwhile, assume that the first pixel size is larger than the second pixel size. Further, in order to change the pixel size, a sampling pitch of the pixel may be changed or the size of an imaging visual field may be changed.

Next, the processing of calculating the feature amount of the deviated portion by using the image of the first pixel size (S2603), and the processing of measuring the overlay by using the image of the second pixel size (S2604) will be described in detail.

The processing of calculating the feature amount of the deviated portion by using the image of the first pixel size (S2603) is executed by using a first image difference quantifying unit 2805. The first image difference quantifying unit 2805 has the same configuration as an image difference quantifying unit 2301 illustrated in FIG. 23, and the procedure is same as the flow illustrated in FIG. 24. The processing of measuring the overlay by using the image of the second pixel size (S2604) is executed by using a second image difference quantifying unit 2806 and an overlay calculation unit 2807. The second image difference quantifying unit 2806 has the same configuration as the image difference quantifying unit (801 in FIG. 8) described in the first embodiment, and the procedure is same as the flow in FIG. 9 described in the first embodiment. Also, the overlay calculation unit 2807 has the same configuration as the overlay calculation unit (811 in FIG. 8) described in the first embodiment, and the procedure is same as the flow described in the first embodiment.

Next, the processing of creating the regression model by the regression analysis (S2606) will be described in detail.

Figure 29:
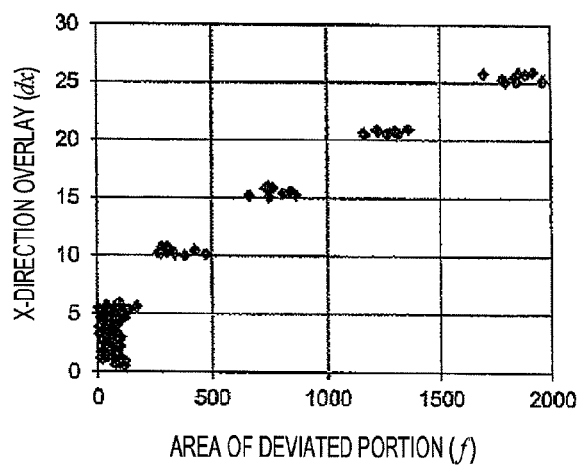
FIG. 29 is a diagram illustrating an exemplary result of plotting a relation of the overlay and a feature amount of a deviated portion.

The regression analyzing processing (S2606) is executed by using a regression analysis unit 2811. The regression analysis unit 2811 receives a feature amount 2808 of the deviated portion output from the first image difference quantifying unit 2805, and X-direction overlay 2809 as well as Y-direction overlay 2810 output from the second image difference quantifying unit. FIG. 29 is a diagram illustrating an example where calculation results of the feature amount 2808 of the deviated portion and the X-direction overlay 2809 at a plurality of measuring coordinates are plotted. In the regression analysis unit 2811, the feature amount of the deviated portion is defined as an explanatory variable and the overlay is defined as an objective variable, and the regression model (mathematical formula) indicating a relation between both variables is calculated based on the regression analysis. A method of the regression analysis may be a least-square method or the like. Further, the feature amount to be used is not necessarily one kind, and, for example, multiple regression analysis may be executed using the area of the deviated portion and the average gray value. With the above configuration, the regression model calculation unit 2202 outputs the regression model 2812 related to the X-direction overlay and the regression model 2813 related to the Y-direction overlay.

Meanwhile, the configuration of the second image difference quantifying unit 2806 may be same as the image difference quantifying unit (FIG. 18) described in a second embodiment. Further, the overlay to be input to the regression analysis unit 2811 may be manually calculated from the image or a result measured by a different measuring apparatus such as a CD-SEM.

Figure 30:
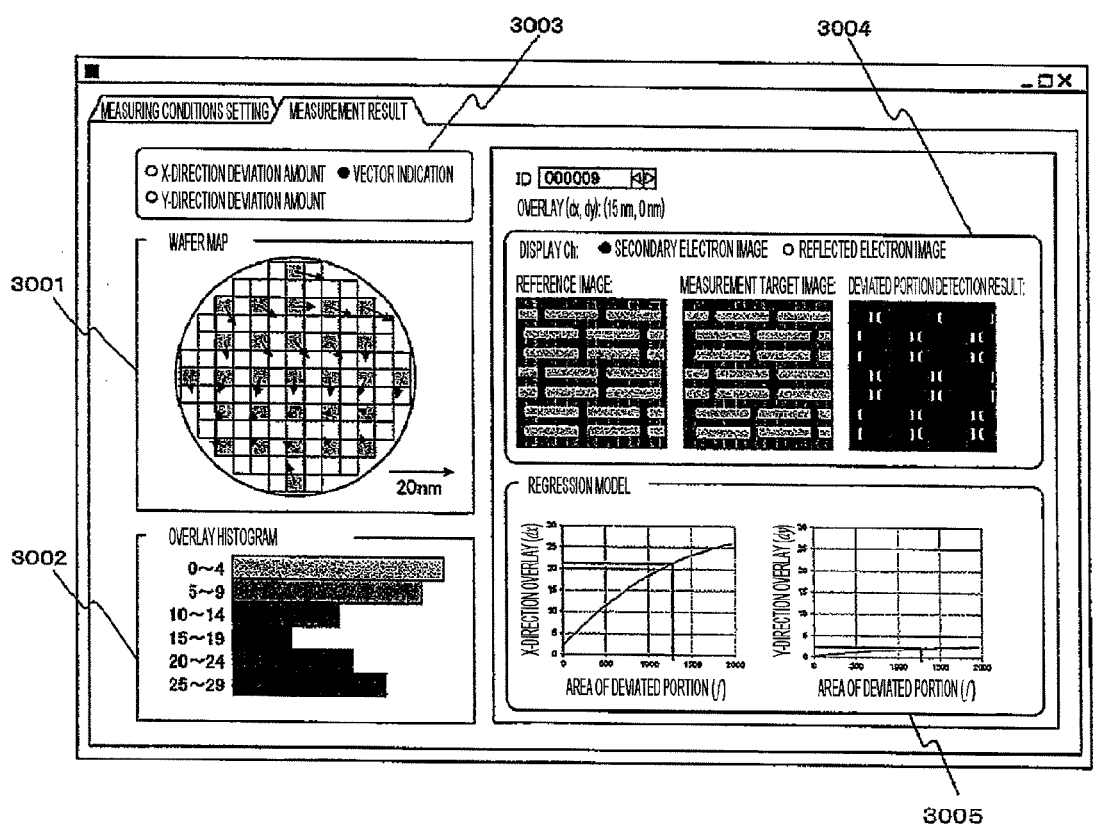
FIG. 30 is a diagram illustrating an exemplary interface for displaying measurement results.

FIG. 30 is a diagram illustrating an exemplary interface for displaying the overlay measurement results according to the present embodiment. This interface includes an interface 3001 for displaying the overlay measurement result superimposed on the wafer, an interface 3002 for displaying a histogram related to the overlay size, and an interface 3003 for designating a measurement result to be displayed on the wafer map or the histogram. Additionally, the interface includes an interface 3004 for displaying the reference image, measurement target image, and a deviated portion detecting result next to each other, and an interface 3005 for displaying the calculated regression model.

As described above, the overlay can be measured in an actual pattern by detecting the difference between the reference image and the measurement target image by the deviated portion, quantifying the feature of the deviated portion as the feature amount, and substituting the feature amount in the regression model preliminarily acquired. According to the present method, the overlay can be measured even in the case where a pixel size is so large that the circuit pattern area can be hardly recognized robustly with high accuracy. As a result thereof, the overlay can be also measured from an image captured with a wide visual field and a measurement area per unit time can be increased.

Fourth Embodiment

According to the first and second embodiments, overlay measuring methods in which the overlay is measured by recognizing a circuit pattern area from a reference image and a measurement target image and then quantifying a positional deviation amount for each circuit pattern formed by each exposure has been described. According to the third embodiment, a method in which the overlay is measured by quantifying a difference between the reference image and the measurement target image as a feature amount of a deviated portion has been described. According to a fourth embodiment, a method in which the overlay is measured with high accuracy by combining the above described embodiments while increasing a measurement area per unit time.

Figure 31:
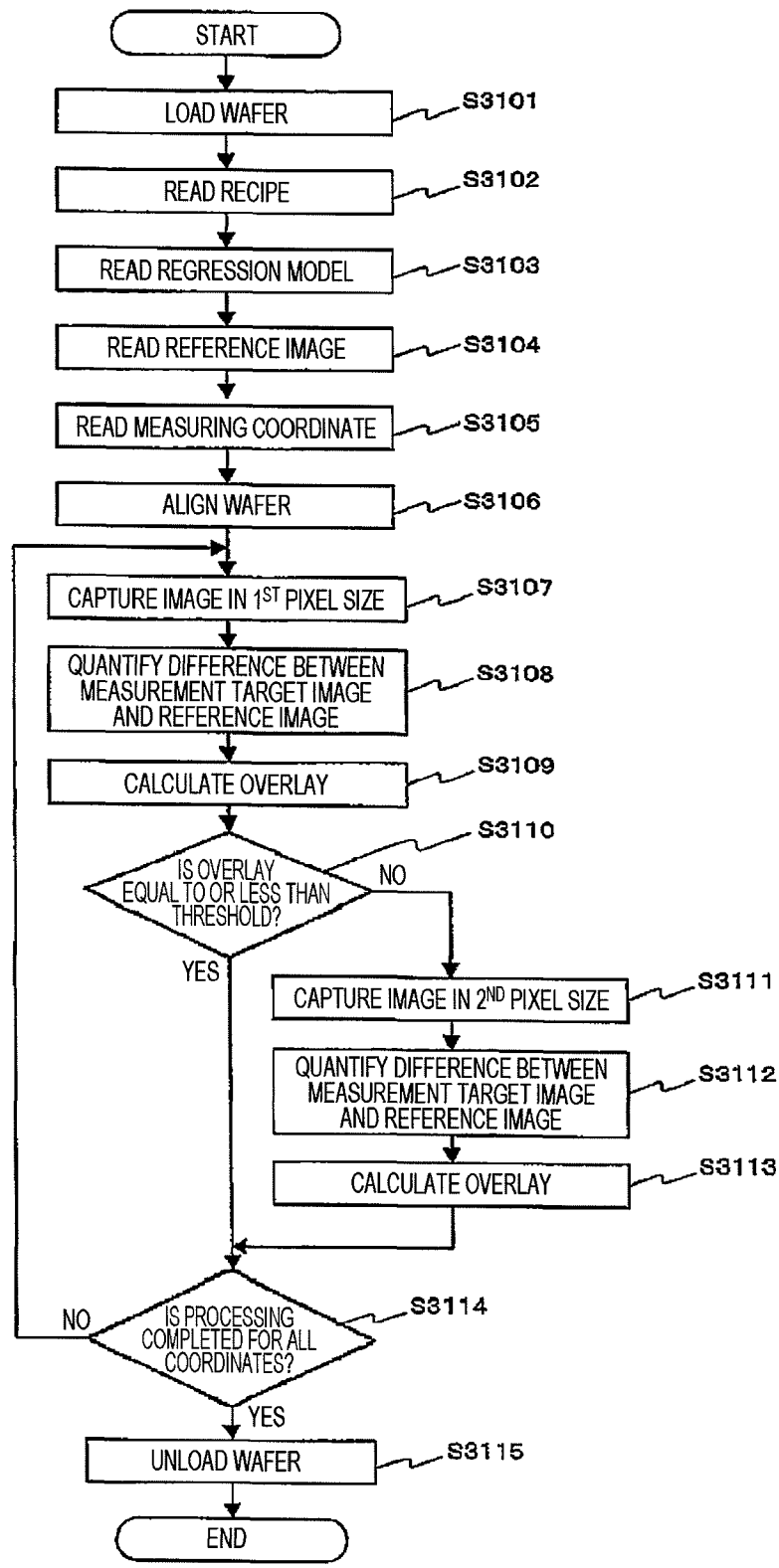
FIG. 31 is a flowchart illustrating the overlay measurement processing according to the present invention.

A configuration of an apparatus according to the present embodiment is same as those illustrated in FIGS. 1 and 22. A flow of overlay measurement processing according to the present embodiment will be described using FIG. 31. FIG. 31 is a flowchart illustrating the overlay measurement processing according to the present invention.

First, a wafer 108 of a measurement target is loaded on a stage 109 (S3101), and a recipe corresponding to the wafer is read from a recipe storage unit 206 (S3102). Next, a regression model preliminarily created is read from a regression model storage unit 2201 (S3103). Then, a reference image preliminarily set is read from an image storage unit 205 (S3104). Next, a measuring coordinate is read from a measuring coordinate storage unit 207 (S3105). After reading the coordinate (or concurrently), wafer alignment is executed after reading the coordinate (S3106). After the wafer alignment, an SEM 101 is controlled to capture an image of a designated coordinate in the first pixel size (S3107). Next, with respect to the image of the first pixel size, a difference between the measurement target image and the reference image is quantified in accordance with processing procedure illustrated in FIG. 24, using an image difference quantifying unit 2301 described in the third embodiment (S3108). Then, the overlay is calculated by using an overlay calculation unit 2308 described in the third embodiment (S3109). Subsequently, the overlay calculated by the processing in S3109 is compared with a predetermined threshold (S3110). In the case where the calculated overlay is larger than the threshold, the SEM 101 is controlled to capture an image at a designated measuring coordinate in a second pixel size (S3111). Then, with respect to the image of the second pixel size, the difference between the measurement target image and the reference image is quantified by using an image difference quantifying unit 801 described in the first embodiment in accordance with a processing procedure illustrated in FIG. 9 (S3112). Next, the overlay is calculated by using an overlay calculation unit 811 described in the first embodiment (S3113). The above processing from S3107 to S3113 is repeatedly executed until the processing is completed for all of the measuring coordinates (S3114). Finally, the wafer is unloaded (S3115).

According to the above-described method, the overlay is measured by using the image of the first pixel size having the wide imaging visual field, thereby achieving to increase the measurement area per unit time. Further, in the case where the overlay measured from the image of the first pixel size is larger than the threshold and measurement with higher accuracy is required, the overlay can be measured with high accuracy by using the image of the second pixel size.

REFERENCE SIGNS LIST 101 scanning electron microscope (SEM)
112 image generation unit
207 measuring coordinate storage unit
208 reference image synthesizing unit
209 image difference quantifying unit
210 overlay calculation unit
412 overlay
S601 measurement target image acquiring step
S603 reference image setting step
S604 step of quantifying difference between measurement target image and reference image
S605 overlay calculating step
801 exemplary configuration of image difference quantifying unit
811 exemplary configuration of overlay calculation unit
S901 step of recognizing circuit pattern area of reference image
S902 image BU creating step
S903 image BL creating step
S904 step of recognizing circuit pattern area of measurement target image
S905 image TU creating step
S906 image TL creating step
S907 positional deviation amount (dux, duy) calculating step
S908 positional deviation amount (dlx, dly) calculating step
1203 example of dux
1204 example of duy
1207 example of dlx
1208 example of dly
2201 regression model storage unit
2202 regression model calculation unit
2301 image difference quantifying unit
2304 deviated portion detecting unit
2305 deviated portion feature amount calculation unit
2308 overlay calculation unit
2310 regression model substituting unit
S2401 deviated portion detecting step
S2402 step of calculating feature amount of deviated portion
2501 exemplary regression model
S2603 step of calculating feature amount of deviated portion by using image of first pixel size
S2604 step of measuring overlay by using image of second pixel size
S2606 step of measuring overlay by using image of second pixel size
S2705 step of capturing image of measuring coordinate in first pixel size
S2706 capturing image of measuring coordinate in second pixel size
2805 unit for calculating feature amount of deviated portion by using image of first pixel size
2806 unit for measuring overlay by using image of second pixel size
2811 unit for creating feature amount of deviated portion and regression model of overlay
S3109 step of measuring overlay from image of first pixel size
S3110 step of comparing overlay calculated from image of first pixel size with threshold
S3111 step of capturing image at measuring coordinate in second pixel size
S3113 step of measuring overlay from image of second pixel size

The invention claimed is:

1. A method for measuring overlay at a semiconductor device on which circuit patterns are formed by a plurality of exposure processes, comprising:
an image capturing step for capturing images of a plurality of areas in the semiconductor device;
a reference image setting step for setting a reference image from a plurality of the images captured in the image capturing step;
a difference quantifying step for quantifying a difference between the reference image set in the reference image setting step and the plurality of the images captured in the image capturing step, in which a positional deviation amount of the circuit pattern between the reference image and the plurality of captured images is quantified for each circuit pattern formed by each exposure, and an overlay calculating step for calculating the overlay based on the difference quantified in the difference quantifying step, wherein the difference quantifying step further comprises creating a first image having extracted a gray value of a circuit pattern area formed by $p^{th}$ or later exposure based on the reference image set in the reference image setting step, and a second image having extracted a gray value of a circuit pattern area formed by $(p-1)^{th}$ or previous exposure, creating a third image having extracted a gray value of a circuit pattern area formed by $p^{th}$ or later exposure based on the plurality of images captured in the image capturing step, and a fourth image having extracted a gray value of a circuit pattern area formed by $(p-1)^{th}$ or previous exposure, and calculating a positional deviation amount between the first image and the third image (dux, duy) and a positional deviation amount between the second image and the fourth image (dlx, dly).

2. The method for measuring overlay according to claim 1, wherein in the overlay calculating step, the positional deviation amount is calculated for each circuit pattern formed by each exposure.

3. The method for measuring overlay according to claim 2, further comprising a circuit pattern recognizing step for recognizing, from among the plurality of images captured in the image capturing step, each of circuit pattern areas formed by $1^{st}$ to $m^{th}$ exposure on the semiconductor device, wherein in the difference quantifying step, a positional deviation amount between the reference image set in the reference image setting step and the plurality of images corresponding to the circuit pattern areas recognized in the circuit pattern recognizing step is calculated, and in the overlay calculating step, a difference of the positional deviation amount calculated in the difference quantifying step is calculated as overlay.

4. The method for measuring overlay according to claim 2, wherein a difference between the dux and duy and a difference between the dlx and dly are calculated as overlay in the overlay calculating step.

5. The method for measuring overlay according to claim 1, wherein in the difference quantifying step, a portion where a difference of contrasting density between the reference image and the plurality of images in a corresponding pixel is higher than a predetermined value is detected as a deviated portion, and appearance of the deviated portion is quantified as a feature amount, and in the overlay calculating step, the overlay is calculated by substituting the feature amount quantified in the difference quantifying step in a regression model.

6. The method for measuring overlay according to claim 5, wherein in the image capturing step, images of a plurality of areas in the semiconductor device are captured in a first pixel size and a second pixel size to obtain a plurality of images, in the difference quantifying step, the image captured in the first pixel size is used from among the plurality of images to calculate a feature amount of a deviated portion, in the overlay calculating step, the image captured in the second pixel size is used from among the plurality of images to measure the overlay, and the method further includes a step of creating a feature amount of a deviated portion and a regression model of overlay.

7. The method for measuring overlay according to claim 1, wherein in the image capturing step, images of a plurality of areas in the semiconductor device are captured in a first pixel size to obtain a plurality of images, in the overlay calculating step, the overlay is measured from the plurality of images captured in the first pixel size, and the method further including:

a comparing step for comparing the calculated overlay in the overlay calculating step with a threshold;

a second image capturing step for capturing images of a plurality of areas in the semiconductor device in a second pixel size to obtain a plurality of images; and a measuring step for measuring the overlay from the plurality of images captured in the second pixel size in the second image capturing step.

8. An apparatus for measuring overlay at a semiconductor device on which circuit patterns are formed by a plurality of exposure processes, comprising:

an imaging unit configured to capture images of a plurality of areas of the semiconductor device;

a reference image setting unit configured to set a reference image from the plurality of images captured by the imaging unit;

a difference quantifying unit configured to quantify a difference between the reference image set by the reference image setting unit and the plurality of images captured by the imaging unit, and to quantify a positional deviation amount of the circuit patterns between the reference image and the plurality of captured images for each circuit pattern formed by each exposure, and an overlay calculation unit configured to calculate the overlay based on the difference quantified by the difference quantifying unit, wherein the difference quantifying unit is further configured to create a first image having extracted a gray value of a circuit pattern area formed by $p^{th}$ or later exposure based on the reference image set by the reference image setting unit, and a second image having extracted a gray value of a circuit pattern area formed by $(p-1)^{th}$ or previous exposure, and further creates a third image having extracted a gray value of a circuit pattern area formed by $p^{th}$ or later exposure based on the plurality of images captured by the imaging unit, and a fourth image having extracted a gray value of a circuit pattern area formed by $(p-1)^{th}$ or previous exposure, and further calculates a positional deviation amount (dux, duy) between the first image and the third image and a positional deviation amount (dlx, dly) between the second image and the fourth image.

9. The apparatus for measuring overlay according to claim 8, wherein in the overlay calculation unit, the positional deviation amount is calculated for each circuit pattern formed by each exposure.

10. The apparatus for measuring overlay according to claim 9, further comprising:

a circuit pattern recognizing unit configured to recognize each of circuit pattern areas formed on the semiconductor device by 1st to $m^{th}$ exposure from among the plurality of the images captured by the imaging unit, wherein in the difference quantifying unit, a positional deviation amount between the reference image set in the reference image setting unit and the plurality of images corresponding to the circuit pattern areas recognized in the circuit pattern recognizing unit is calculated, and in the overlay calculation unit, a difference of the positional deviation amount calculated in the difference quantifying unit is calculated as overlay.

11. The apparatus for measuring overlay according to claim 9, wherein the overlay calculation unit calculates a difference between the dux and duy and a difference between the dlx and dly as overlay.

12. A scanning electron microscope, comprising:

an apparatus for measuring overlay according to claim 9; and an image processing unit configured to process images of the semiconductor device captured by the imaging unit.

13. A scanning electron microscope, comprising:

an apparatus for measuring overlay according to claim 10; and an image processing unit configured to process images of the semiconductor device captured by the imaging unit.

14. A scanning electron microscope, comprising:

an apparatus for measuring overlay according to claim 11; and an image processing unit configured to process images of the semiconductor device captured by the imaging unit.

15. The apparatus for measuring overlay according to claim 8, wherein in the difference quantifying unit, a portion where a difference of contrasting density between the reference image and the plurality of images in a corresponding pixel is higher than a predetermined value is detected as a deviated portion, and appearance of the deviated portion is quantified as a feature amount, and in the overlay calculation unit, the overlay is calculated by substituting the feature amount quantified in the difference quantifying unit in a regression model.

16. The apparatus for measuring overlay according to claim 15, wherein in the imaging unit, images of a plurality of areas in the semiconductor device are captured in a first pixel size and a second pixel size to obtain a plurality of images, in the difference quantifying unit, image captured in the first pixel size is used from among the plurality of images to calculate a feature amount of a deviated portion, in the overlay calculation unit, the image captured in the second pixel size is used from among the plurality of images to measure overlay, and the apparatus further includes a regression model creating unit configured to create a feature amount of a deviated portion and a regression model of overlay.

17. A scanning electron microscope, comprising:

an apparatus for measuring overlay according to claim 15; and an image processing unit configured to process images of the semiconductor device captured by the imaging unit.

18. A scanning electron microscope, comprising:

an apparatus for measuring overlay according to claim 16; and an image processing unit configured to process images of the semiconductor device captured by the imaging unit.

19. A scanning electron microscope, comprising:

an apparatus for measuring overlay according to claim 8; and an image processing unit configured to process images of the semiconductor device captured by the imaging unit.

\* \* \* \* \*